US012563882B2

(12) United States Patent
Cho et al.

(10) Patent No.: US 12,563,882 B2
(45) Date of Patent: Feb. 24, 2026

(54) ELECTRONIC DEVICE

(71) Applicant: Samsung Display Co., Ltd., Yongin-si (KR)

(72) Inventors: Kunwook Cho, Yongin-si (KR); Soung Wook Kim, Yongin-si (KR); Minsoo Choi, Yongin-si (KR); Seokgyu Yoon, Yongin-si (KR); Jin-Soo Jung, Yongin-si (KR); Hyejin Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 388 days.

(21) Appl. No.: 18/361,400

(22) Filed: Jul. 28, 2023

(65) Prior Publication Data

US 2024/0107783 A1 Mar. 28, 2024

(30) Foreign Application Priority Data

Sep. 2, 2022 (KR) ........................ 10-2022-0111550

(51) Int. Cl.
*H10K 30/20* (2023.01)
*H10K 39/34* (2023.01)
(Continued)

(52) U.S. Cl.
CPC ............ *H10K 30/20* (2023.02); *H10K 39/34* (2023.02); *H10K 59/122* (2023.02); (Continued)

(58) Field of Classification Search
CPC ...... H10K 30/20; H10K 39/34; H10K 59/122; H10K 85/626; H10K 85/649;
(Continued)

(56) References Cited

U.S. PATENT DOCUMENTS 8,778,512 B2 7/2014 Dorok et al.
10,032,983 B2 7/2018 Chen et al.
(Continued)

FOREIGN PATENT DOCUMENTS

JP 2021-012366 A 2/2021
KR 10-1891224 B1 8/2018
(Continued)

*Primary Examiner* — Douglas W Owens
(74) *Attorney, Agent, or Firm* — Womble Bond Dickinson (US) LLP

(57) ABSTRACT

An electronic device may include: a base layer; and a display element layer including a pixel defining film having an opening defined therein, and a light emitting element and a light receiving element which are divided by the pixel defining film, wherein the light emitting element and the light receiving element each include: a first electrode, a hole transport region on the first electrode, an electron transport region including a hole blocking layer, and a second electrode. The light emitting element includes an emission layer between the hole transport region and the electron transport region, and the light receiving element includes a light receiving layer between the hole transport region and the electron transport region, and an electron extraction layer between the light receiving layer and the electron transport region and including an n-dopant material.

26 Claims, 10 Drawing Sheets

(51) Int. Cl.
*H10K 59/122* (2023.01)
*H10K 85/60* (2023.01)

(52) U.S. Cl.
CPC ......... *H10K 85/626* (2023.02); *H10K 85/649* (2023.02); *H10K 85/654* (2023.02); *H10K 85/655* (2023.02); *H10K 85/656* (2023.02); *H10K 85/6572* (2023.02); *H10K 85/6574* (2023.02)

(58) Field of Classification Search
CPC .. H10K 85/654; H10K 85/655; H10K 85/656; H10K 85/6572; H10K 85/6574; H10K 50/16; H10K 50/18; H10K 30/85; H10K 65/00; H10K 50/15; H10K 50/81; H10K 50/82; H10K 59/35; H10K 59/40; H10K 85/657
See application file for complete search history.

(56) References Cited

U.S. PATENT DOCUMENTS

| | | | | |
|---|---|---|---|---|
| 11,495,761 | B2 | 11/2022 | Heo et al. | |
| 2021/0005669 | A1 | 1/2021 | Kamada et al. | |
| 2021/0234103 | A1 | 7/2021 | Lim et al. | |
| 2021/0273192 | A1 | 9/2021 | Kim et al. | |
| 2021/0336176 | A1* | 10/2021 | Kawano | H10K 85/30 |
| 2022/0263029 | A1* | 8/2022 | Galán García | C09K 11/06 |

FOREIGN PATENT DOCUMENTS

| | | | |
|---|---|---|---|
| KR | 10-2020-0132537 | A | 11/2020 |
| KR | 10-2197160 | B1 | 12/2020 |
| KR | 10-2021-0103631 | A | 8/2021 |
| KR | 10-2022-0152591 | A | 11/2022 |

* cited by examiner

ELECTRONIC DEVICE

CROSS-REFERENCE TO RELATED APPLICATION

This application claims priority to and the benefit of Korean Patent Application No. 10-2022-0111550, filed on Sep. 2, 2022, in the Korean Intellectual Property Office, the entire content of which is hereby incorporated by reference.

BACKGROUND

1. Field

One or more embodiments of the present disclosure relate to an electronic device including a light receiving element in an active region.

2. Description of the Related Art

Various types (kinds) of electronic devices are utilized to provide image information, and these electronic devices provide one or more suitable functions that allow interactive communication with users, such as detecting user inputs. In particular, current display devices may include a function for detecting external inputs provided from the outside.

External input recognition methods may include a capacitance method detecting changes in capacitance formed between electrodes, an optical method detecting incident light utilizing an optical sensor, and/or an ultrasonic method detecting vibration utilizing a piezoelectric material. When the optical sensor is included, it is desired or needed to increase efficiency of converting received light into electrical signals to improve sensitivity of light receiving elements.

SUMMARY

One or more aspects of embodiments of the present disclosure are directed toward an electronic device having increased efficiency in a light receiving element.

Additional aspects will be set forth in part in the description which follows and, in part, will be apparent from the description, or may be learned by practice of the presented embodiments.

According to one or more embodiments of the present disclosure, an electronic device may include: a base layer; and a display element layer on the base layer and including a pixel defining film having an opening defined therein, and a light emitting element and a light receiving element which are divided by the pixel defining film, wherein the light emitting element and the light receiving element each include: a first electrode; a hole transport region on the first electrode; an electron transport region on the hole transport region and including a hole blocking layer containing a triazine-based compound, and a sub electron transport region on the hole blocking layer; and a second electrode on the electron transport region, the light emitting element includes an emission layer disposed between the hole transport region and the electron transport region, and the light receiving element includes a light receiving layer disposed between the hole transport region and the electron transport region and converting incident light into electrical signals, and an electron extraction layer between the light receiving layer and the electron transport region and including an n-dopant material.

In one or more embodiments, the n-dopant material may include a metal having a work function of 3.0 eV or less.

In one or more embodiments, the n-dopant material may include lithium (Li), ytterbium (Yb), magnesium (Mg), silver (Ag), calcium (Ca), or sodium (Na).

In one or more embodiments, the electron extraction layer may further include an organic compound, and the organic compound may form a chelate with the metal having a work function of 3.0 eV or less.

In one or more embodiments, the organic compound may be represented by any one selected from among compounds of Compound Group 2 and compounds of Compound Group 3 described herein.

In one or more embodiments, the n-dopant material may have a doping concentration of about 0.5 vol % to about 10 vol % with respect to the organic compound.

In one or more embodiments, an acceptor compound may include a fullerene derivative, a perylene tetracarboxylic diimide (PTCDI) derivative, a perylene tetracarboxylic dianhydride (PTCDA) derivative, a 1,4,5,8-naphthalenetetracarboxylic dianhydride (NTCDA) derivative, or a naphthalenetetracarboxylic diimide (NTCDI) derivative.

In one or more embodiments, the electron extraction layer may further include the acceptor compound.

In one or more embodiments, the electron extraction layer may include a first sub electron extraction layer further including the acceptor compound, and a second sub electron extraction layer not including the acceptor compound.

In one or more embodiments, a donor compound may include a phthalocyanine-based compound or a perylene-based compound.

In one or more embodiments, the light receiving layer may include a first sub light receiving layer including the donor compound and not including the acceptor compound, and a second sub light receiving layer on the first sub light receiving layer, not including the donor compound, and including the acceptor compound.

In one or more embodiments, the light receiving layer may include a first sub light receiving layer including the donor compound and not including the acceptor compound, and a second sub light receiving layer on the first sub light receiving layer and including the donor compound and the acceptor compound.

In one or more embodiments, the electron extraction layer may have a thickness of about 10 Å to about 100 Å.

In one or more embodiments, the hole blocking layer may be provided as a single layer in the light emitting element and the light receiving element.

In one or more embodiments, the hole blocking layer may not include (e.g., may exclude) the n-dopant material.

In one or more embodiments, the triazine-based compound may be represented by any one selected from among ET-31 to ET-37 described herein.

According to one or more embodiments of the present disclosure, an electronic device may include a display module divided into a red light emitting region, a green light emitting region, a blue light emitting region, and a light receiving region, which are spaced apart (e.g., separated from each other) when viewed on a plane (e.g., in a plan view), wherein the display module includes: a base layer; a display element layer on the base layer and including a light emitting element and a light receiving element; and an input sensing layer on the display element layer, the display module including: a first electrode; a hole transport region on the first electrode; an electron transport region on the hole transport region and including a hole blocking layer containing a triazine-based compound, and a sub electron transport region on the hole blocking layer; and a second electrode on the electron transport region, the light emitting element including an emission layer between the hole transport region and the electron transport region, and the light receiving element including a light receiving layer between the hole transport region and the electron transport region, and an electron extraction layer between the light receiving layer and the electron transport region and non-overlapping the emission layer.

In one or more embodiments, the electron extraction layer may include an n-dopant material, and the hole blocking layer may not include (e.g., may exclude) the n-dopant material.

In one or more embodiments, the electron extraction layer may include a metal having a work function of 3.0 eV or less, or a metal having a work function of 3.0 eV or less and an organic compound forming a chelate with the metal.

In one or more embodiments, the organic compound may be represented by any one selected from among compounds of Compound Group 2 and compounds of Compound Group 3 described herein.

In one or more embodiments, the light receiving layer may include a donor compound and an acceptor compound, and the acceptor compound may include a fullerene derivative, a perylene tetracarboxylic diimide (PTCDI) derivative, a perylene tetracarboxylic dianhydride (PTCDA) derivative, a 1,4,5,8-naphthalenetetracarboxylic dianhydride (NTCDA) derivative, or a naphthalenetetracarboxylic diimide (NTCDI) derivative.

In one or more embodiments, the electron extraction layer may further include the acceptor compound.

In one or more embodiments, the light emitting element may include a red light emitting element corresponding to the red light emitting region, a blue light emitting element corresponding to the blue light emitting region, and a green light emitting element corresponding to the green light emitting region.

In one or more embodiments, the hole transport region below the light receiving layer may be formed of the same material as the hole transport region below the emission layer.

In one or more embodiments, the electron transport region above the light receiving layer may be formed of (e.g., composed of) the same material as the electron transport region above the emission layer.

In one or more embodiments, the triazine-based compound may be represented by any one selected from among ET-31 to ET-37 described herein.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
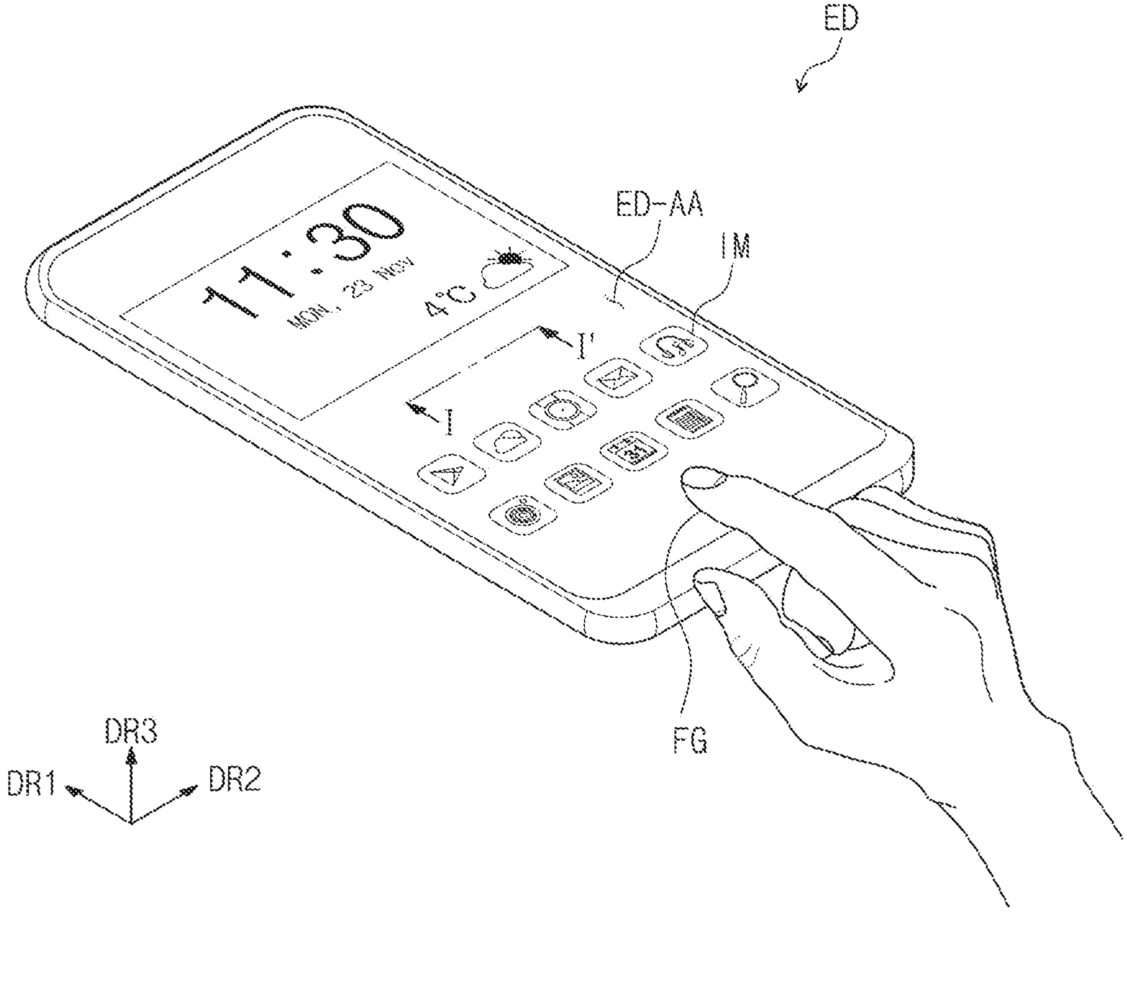
FIG. 1 is a perspective view of an electronic device according to one or more embodiments of the present disclosure.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

As utilized herein, when an element (or a region, a layer, a portion, etc.) is referred to as being "on," "connected to," or "coupled to" another element, it may refer to that the element may be directly disposed on/connected to/coupled to the other element, or that a third element may be disposed therebetween.

However, in the present disclosure, being "disposed directly on" may refer to that there is no additional layer, film, region, plate, and/or the like between a part and another part such as a layer, a film, a region, a plate, and/or the like. For example, being "disposed directly on" may refer to that two layers or two members are disposed without utilizing an additional member such as an adhesive member, therebetween.

Like numbers refer to like elements throughout the present disclosure, and duplicative descriptions thereof may not be provided for conciseness. In some embodiments, in the drawings, the thickness, the ratio, and the dimensions of elements are exaggerated for an effective description of technical contents.

The term "and/or," or "or" may include all combinations of one or more of which associated configurations may define. Expressions such as "at least one of," "one of," and "selected from," when preceding a list of elements, modify the entire list of elements and do not modify the individual elements of the list. For example, "at least one of a, b, or c", "at least one selected from a, b, and c", "at least one selected from among a to c", etc., may indicate only a, only b, only c, both (e.g., simultaneously) a and b, both (e.g., simultaneously) a and c, both (e.g., simultaneously) b and c, all of a, b, and c, or variations thereof. The "/" utilized herein may be interpreted as "and" or as "or" depending on the situation.

It will be understood that, although the terms "first," "second," etc. may be utilized herein to describe one or more suitable elements, these elements should not be limited by these terms. These terms are only utilized to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

In some embodiments, terms such as "below," "lower," "above," "upper," and/or the like are utilized to describe the relationship of the configurations shown in the drawings. The terms are utilized as a relative concept and are described with reference to the direction indicated in the drawings. In the present disclosure, being "disposed on" may represent not only being disposed on the top surface but also being disposed on the bottom surface.

Unless otherwise defined, all terms (including technical and scientific terms) utilized herein have the same meaning as commonly understood by one of ordinary skill in the art to which the present disclosure belongs. In some embodiments, terms, such as those defined in commonly utilized dictionaries, should be interpreted as having a meaning that is consistent with their meaning in the context of the relevant art and should not be interpreted in an idealized or overly formal sense unless expressly so defined herein.

It should be understood that the terms "comprise(s)," "include(s)," or "have/has" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an electronic device according to one or more embodiments of the present disclosure will be described in with reference to the drawings.

Figure 2:
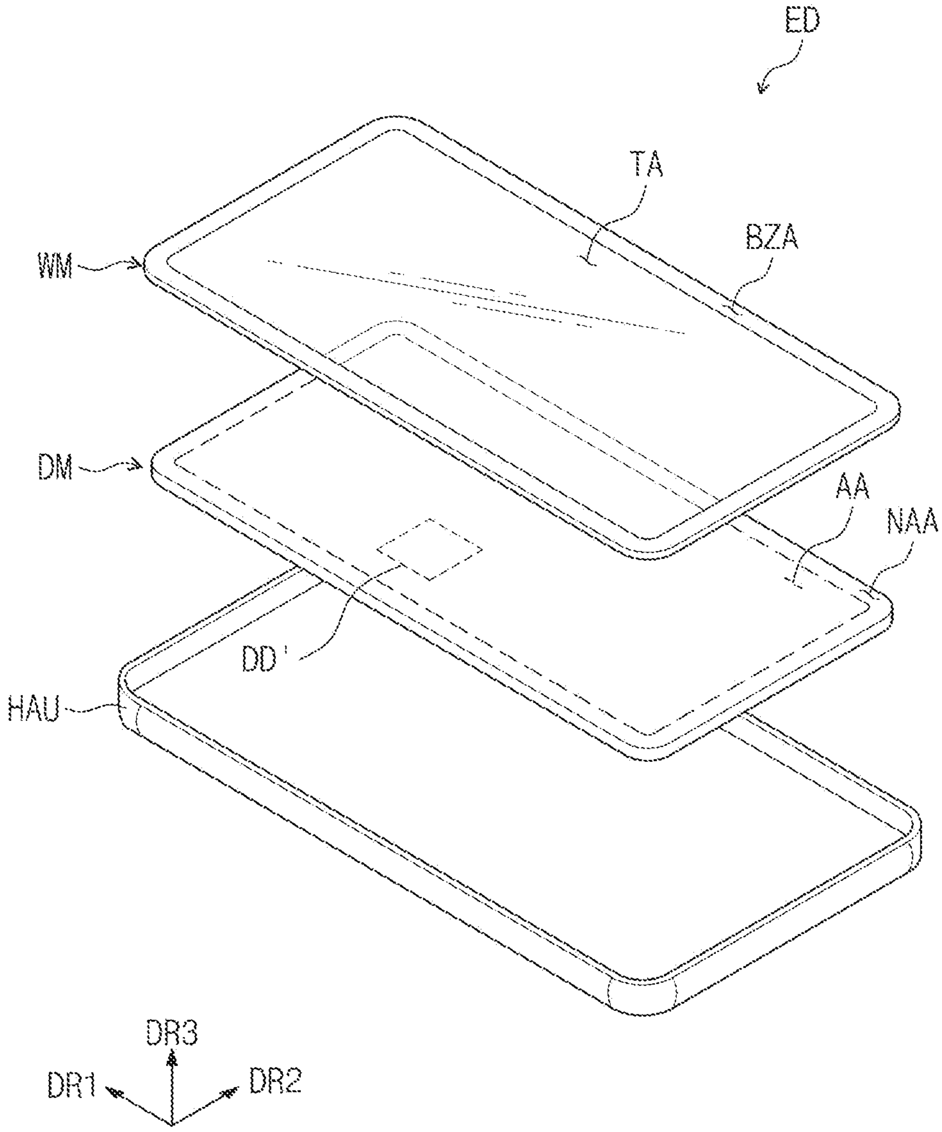
FIG. 2 is an exploded perspective view of an electronic device according to one or more embodiments of the present disclosure.
Figure 3:
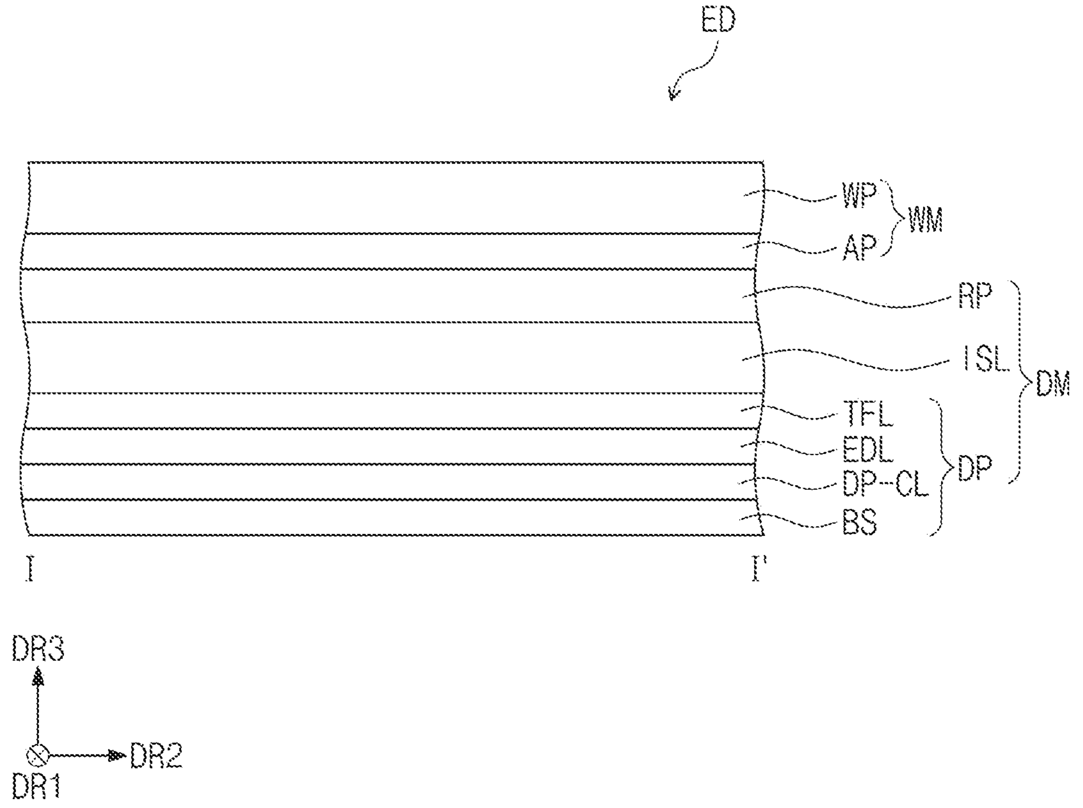
FIG. 3 is a cross-sectional view of an electronic device according to one or more embodiments of the present disclosure.

FIG. 1 is a perspective view showing an electronic device according to one or more embodiments of the present disclosure. FIG. 2 is an exploded perspective view showing an electronic device according to one or more embodiments of the present disclosure. FIG. 3 is a cross-sectional view schematically showing a portion corresponding to line I-I' of FIG. 1.

According to one or more embodiments of the present disclosure, an electronic device ED shown in FIGS. 1 and 3 may be a device activated according to electrical signals. For example, the electronic device ED may be a mobile phone, a tablet, a car navigation system, a game console, or a wearable device, but the embodiment is not limited thereto. In FIG. 1, a mobile phone is shown as the electronic device ED by way of example.

The electronic device ED may display an image IM through an active region ED-AA. The active region ED-AA may include a plane defined by a first direction axis DR1 and a second direction axis DR2. The active region ED-AA may further include a curved surface bent from at least one side of the plane defined by the first direction axis DR1 and the second direction axis DR2. For example, in some embodiments, the active region ED-AA may include the plane alone, and the active region ED-AA may further include curved surfaces each bent from at least two sides of the plane (e.g., four curved surfaces each bent from four sides of the plane).

In some embodiments, FIG. 1 and the following drawings may show the first to fourth direction axes DR1 to DR4, and directions indicated by the first to fourth direction axes DR1, DR2, DR3, and DR4 as described herein are relative concepts, and may thus be changed to other directions. In some embodiments, the directions indicated by the first to fourth direction axes DR1, DR2, DR3, and DR4 may be described as first to fourth directions, and the same reference numerals may be utilized.

The first direction axis DR1 and the second direction axis DR2 herein may be perpendicular to each other, and a third direction axis DR3 may be a normal direction with respect to a plane defined by the first direction axis DR1 and the second direction axis DR2. The fourth direction axis DR4 may be a direction between the first direction axis DR1 and the second direction axis DR2.

A thickness direction of the electronic device ED may be parallel to the third direction axis DR3 which is a normal direction with respect to a plane defined by the first direction axis DR1 and the second direction axis DR2. As described herein, a front surface (or an upper surface) and a rear surface (or a lower surface) of members constituting the electronic device ED may be defined with respect to the third direction axis DR3.

The image IM provided in electronic device ED of one or more embodiments may include still images as well as dynamic images. In FIG. 1, a watch window and icons are shown as an example of the image IM. A surface on which the image IM is displayed may correspond to a front surface of the electronic device ED and may also correspond to a front surface of a window (e.g., a window member) WM (e.g., referring to FIG. 2).

In some embodiments, the electronic device ED according to one or more embodiments may detect user inputs applied from the outside (e.g., from a user). For example, the user inputs may include one or more suitable types (kinds) of external inputs such as a portion of the user's body, light, heat, and/or pressure. The electronic device ED of one or more embodiments may detect the user inputs through the active region ED-AA and respond to detected input signals. In some embodiments, the user inputs applied to a side surface or a rear surface of the electronic device ED may also be detected depending on a provided design of the electronic device ED, and embodiments of the present disclosure are not limited thereto.

For example, the electronic device ED according to one or more embodiments may detect biometric information such as a user's fingerprint FG applied from the outside. A fingerprint recognition region may be provided in the active region ED-AA of the electronic device ED. The fingerprint recognition region may be provided in an entire region of the active region ED-AA or may be provided in some region of the active region ED-AA. In some embodiments, the fingerprint recognition region may be an external input recognition region that detects not only the user's biometric information but also inputs provided from the outside.

Referring to FIGS. 2 and 3, the electronic device ED of one or more embodiments may include a display module DM, a window member WM, and a housing HAU. In one or more embodiments, the window member WM and the housing HAU may be bonded together to form an exterior of the electronic device ED.

The display module DM according to one or more embodiments may be divided into an active region AA and a peripheral region NAA. The active region AA may be a region activated according to electrical signals. As described above, the active region AA may be a portion that displays images or detects external inputs.

The peripheral region NAA may be a region adjacent to at least one side of the active region AA. The peripheral region NAA may be disposed to surround the active region AA. However, embodiments of the present disclosure are not limited thereto, and a portion of the peripheral region NAA may not be provided in one or more embodiments unlike what is shown in FIG. 2 and/or the like. A driving circuit, a driving line, and/or the like for driving the active region AA may be disposed in the peripheral region NAA.

Figure 5:
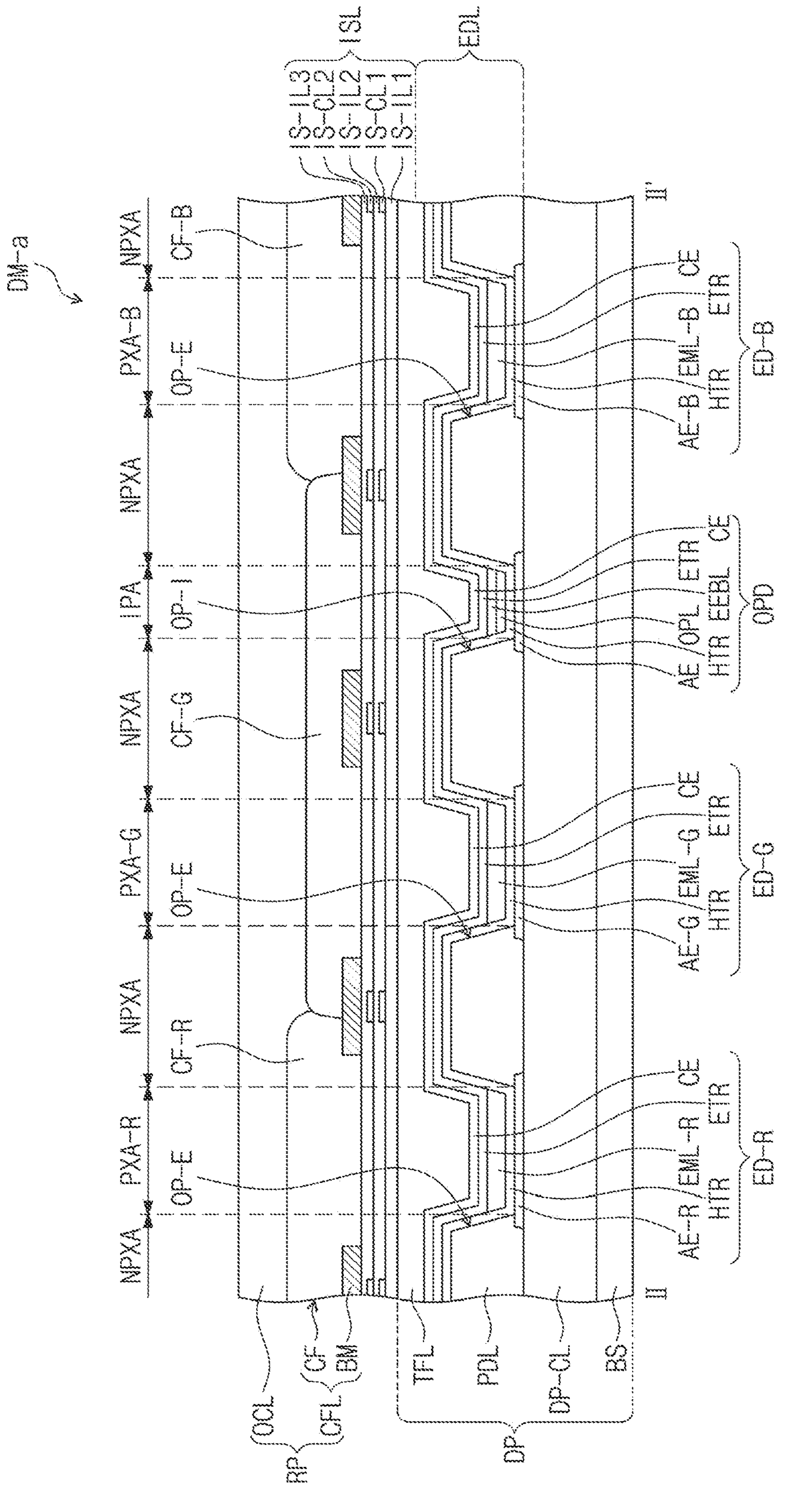
FIG. 5 is a cross-sectional view showing a portion of a display module according to one or more embodiments of the present disclosure.

The electronic device ED according to one or more embodiments may include light emitting elements ED-ft ED-G, and ED-B (FIG. 5) and a light receiving element OPD (FIG. 5). For example, the electronic device ED according to one or more embodiments may display images through the operation of the light emitting elements ED-ft ED-G, and ED-B, and the light receiving element OPD (FIG. 5) and detect external inputs through the operation of the light receiving element OPD (FIG. 5).

The display module DM according to one or more embodiments may include a display panel DP and an input sensing layer ISL disposed on the display panel DP. In some embodiments, the display module DM may include an anti-reflection member RP. In some embodiments, the anti-reflection member RP may be disposed on the input sensing layer ISL. In some embodiments, when the input sensing layer ISL is omitted (e.g., not provided), the anti-reflection member RP may be disposed on the display panel DP.

The display panel DP may include a base layer BS and a display element layer EDL disposed on the base layer BS. In some embodiments, the display panel DP may include a base layer BS, a circuit layer DP-CL disposed on the base layer BS, a display element layer EDL disposed on the circuit layer DP-CL, and an encapsulation layer TFL disposed on the display element layer EDL. The encapsulation layer TFL may cover the display element layer EDL.

In some embodiments, the electronic device ED may further include a window member WM disposed on the display module DM. The window member WM may include a window WP and an adhesive layer AP, and the adhesive layer AP may be disposed between the display module DM and the window WP. The adhesive layer AP may be an optically clear adhesive film (OCA) or an optically clear adhesive resin layer (OCR). In some embodiments, the adhesive layer AP may not be provided.

The window WP may cover an entire outer portion of the display module DM. The window WP may have a shape corresponding to a shape of the display module DM. In the electronic device ED of one or more embodiments, the window WP may include an optically transparent insulating material. The window WP may be a glass substrate or a polymer substrate. For example, in some embodiments, the window WP may be a tempered glass substrate subjected to strengthening treatment. The window WP may correspond to an uppermost layer of the electronic device ED.

In some embodiments, in the electronic device ED, the window member WM may be divided into a transmission portion TA and a bezel portion BZA. The transmissive portion TA may correspond to the active region AA of the display module DM, and the bezel portion BZA may correspond to the peripheral region NAA of the display module DM.

A front surface of the window member WM including the transmission portion TA and the bezel portion BZA corresponds to a front surface of the electronic device ED. Users may view images provided through the transmission portion TA corresponding to the front surface of the electronic device ED.

The bezel portion BZA may define a shape of the transmission portion TA. The bezel portion BZA may be adjacent to the transmission portion TA and may surround the transmission portion TA. However, embodiments of the present disclosure are not limited to what is shown, and the bezel portion BZA may be adjacent to only one side of the transmission portion TA and a portion thereof may not be provided.

In the electronic device ED of one or more embodiments, a portion of the electronic device ED, which is viewed through the bezel portion BZA, may have a lower light transmittance than a portion viewed through the transmission portion TA. In some embodiments, in the electronic device ED, the bezel portion BZA may be a portion viewed as having a set or predetermined color.

In the electronic device ED of one or more embodiments, the anti-reflection member RP may include a color filter layer or a polarization layer. For example, in some embodiments, the anti-reflection member RP may reduce reflectance of external light incident from the outside, or absorb and block or reduce a portion of light incident from the outside.

The input sensing layer ISL included in the electronic device ED of one or more embodiments may be disposed on the display panel DP. The input sensing layer ISL may detect external inputs applied from the outside (e.g., from a user). The external inputs may be user inputs. The user inputs may include one or more suitable types (kinds) of external inputs such as a part of a user's body, light, heat, pen, and/or pressure.

Figure 4:
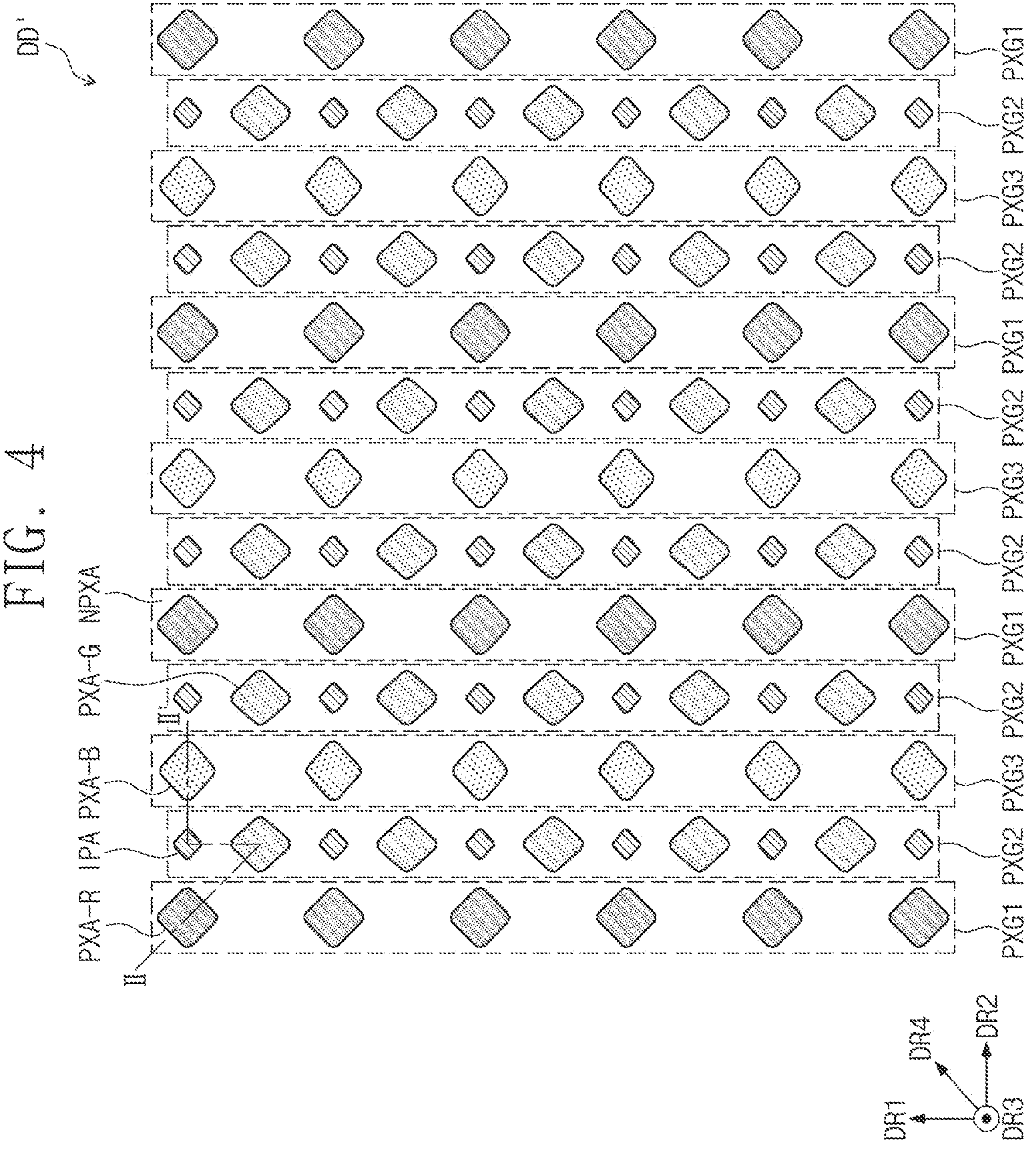
FIG. 4 is a plan view of a portion of a display module according to one or more embodiments of the present disclosure.

FIG. 4 is a plan view showing a portion of a display module according to one or more embodiments of the present disclosure. FIG. 5 is a cross-sectional view showing a portion of a display module according to one or more embodiments of the present disclosure. FIG. 4 is a plan view showing a region DD' of FIG. 2, and FIG. 5 is a cross-sectional view showing a portion corresponding to line II-II' of FIG. 4.

The display module DM according to one or more embodiments may include a plurality of light emitting regions PXA-R, PXA-G, and PXA-B and a light receiving region IPA, which are disposed in the active region AA. The display module DM may include a red light emitting region PXA-R emitting red light, a green light emitting region PXA-G emitting green light, and a blue light emitting region PXA-B emitting blue light. In some embodiments, the display module DM may include the light receiving region IPA receiving and sensing incident light that is reflected by external objects. A non-light emitting region NPXA may be disposed between the light emitting regions PXA-R, PXA-G, and PXA-B and between the light emitting regions PXA-R, PXA-G, and PXA-B and the light receiving region IPA. Each of the light emitting regions PXA-R, PXA-G, and PXA-B, and the light emitting regions PXA-R, PXA-G, and PXA-B and the light receiving region IPA may be distinguished and separated by the non-light emitting region NPXA. The non-light emitting region NPXA may surround each of the light emitting regions PXA-R, PXA-G, and PXA-B and the light receiving region IPA.

In one or more embodiments, the light emitting regions emitting light of different wavelength ranges among the plurality of light emitting regions PXA-R, PXA-G, and PXA-B may have different surface areas from one another. In these cases, the surface area may refer to an area when viewed on a plane (e.g., in a plan view) defined by the first direction axis DR1 and the second direction axis DR2.

However, embodiments of the present disclosure are not limited thereto, and the light emitting regions PXA-R, PXA-G, and PXA-B may have the same surface area or different surface area ratios unlike what is shown in FIG. 5. In some embodiments, the light emitting regions PXA-R, PXA-G, and PXA-B may be to emit light having a different color except for the red light, the green light, or the blue light, or have a planar shape different from the illustrated shape.

In some embodiments, the light receiving region IPA may have a surface area smaller than that of each of the red light emitting region PXA-R, the green light emitting region PXA-G, and the blue light emitting region PXA-B when viewed on a plane (e.g., in a plan view). However, embodiments of the present disclosure are not limited thereto, and the light receiving region IPA may have a surface area equal to or greater than that of at least any one selected from among the red light emitting region PXA-R, the green light emitting region PXA-G, and the blue light emitting region PXA-B.

Referring to FIG. 4, in one or more embodiments, the red light emitting regions PXA-R may be arranged to be spaced apart along the first direction axis DR1 to form a first group PXG1. The green light emitting regions PXA-G and the light receiving regions IPA may be alternately arranged along the first direction axis DR1 to form a second group PXG2. In addition, the blue light emitting regions PXA-B may be arranged to be spaced apart along the first direction axis DR1 to form a third group PXG3.

The first group PXG1 to the third group PXG3 may be sequentially arranged in a direction of the second direction axis DR2. Each of the first group PXG1 to the third group PXG3 may be provided in plurality. In embodiments of the present disclosure shown in FIG. 4, the first group PXG1, the second group PXG2, the third group PXG3, and the second group PXG2 constitute one repetition unit along the second direction axis DR2, and these repetition units are repeated and arranged in the second direction axis DR2.

In one or more embodiments, one green light emitting region PXA-G may be disposed to be spaced apart from one red light emitting region PXA-R or one blue light emitting region PXA-B in a direction of the fourth direction axis DR4. The fourth direction axis DR4 may be a direction between the first direction axis DR1 and the second direction axis DR2.

In some embodiments, the light receiving region IPA is spaced apart from each of the light emitting regions PXA-R, PXA-G, and PXA-B, and disposed to be spaced apart between the red light emitting region PXA-R and the blue light emitting region PXA-B in the second direction axis DR2. The light receiving region IPA and the green light emitting region PXA-G may be alternately arranged along the first direction axis DR1.

An arrangement structure of the light emitting regions PXA-R, PXA-G, and PXA-B shown in FIG. 4 may be referred to as a pentile (PENTILE®) structure. PENTILE® is a duly registered trademark of Samsung Display Co., Ltd. However, an arrangement structure of the light emitting regions PXA-R, PXA-G, and PXA-B in an electronic device according to one or more embodiments is not limited to the arrangement structure shown in FIG. 4. For example, in one or more embodiments, the light emitting regions PXA-B, PXA-G, and PXA-R may have a stripe structure in which the red light emitting region PXA-R, the green light emitting region PXA-G, and the blue light emitting region PXA-B are sequentially and alternately arranged. In some embodiments, in the stripe arrangement structure, the light receiving region IPA may form the same row or the same column along with the green light emitting region PXA-G to form a single stripe arrangement. However, in one or more embodiments, the arrangement shape and the arrangement ratio of the light receiving region IPA and the light emitting regions PXA-R, PXA-G, and PXA-B may be different from the above-described arrangement shape.

FIG. 5 is a cross-sectional view showing a portion of the display module according to one or more embodiments. FIG. 5 is a cross-sectional view showing a portion of the light emitting regions PXA-R, PXA-G, and PXA-B and the light receiving region IPA as an example. For example, FIG. 5 is a cross-sectional view shown a portion of the electronic device ED (FIG. 3) according to one or more embodiments.

The electronic device according to one or more embodiments may include light emitting elements ED-ft ED-G, and ED-B and a light receiving element OPD. The light emitting elements ED-ft ED-G, and ED-B may generate light according to electrical signals. In addition, the light receiving element OPD may receive optical signals and convert the signals into electrical signals.

Referring to FIG. 5, the electronic device according to one or more embodiments may include a base layer BS, a display element layer EDL disposed on the base layer BS, an input sensing layer ISL disposed on the display element layer EDL, and an anti-reflection member RP disposed on the input sensing layer ISL. The display element layer EDL may include a pixel defining film PDL, and light emitting elements ED-ft ED-G, and ED-B and a light receiving element OPD which are distinguished or separated by a pixel defining film PDL. In some embodiments, the anti-reflection member RP may include a color filter layer CFL and an organic planarization layer OCL.

In one or more embodiments, the light emitting elements ED-ft ED-G, and ED-B may include a first electrode AE-R, AE-G, and AE-B, respectively, a hole transport region HTR, emission layers EML-R, EML-G, and EML-B, respectively, an electron transport region ETR, and a second electrode CE. In addition, the light receiving element OPD may include a first electrode AE, a hole transport region HTR, a light receiving layer OPL, an electron extraction layer EEBL, an electron transport region ETR, and a second electrode CE, which are sequentially stacked (e.g., in the stated order).

In one or more embodiments, the light receiving layer OPL included in the light receiving element OPD may be a photoactive layer that converts incident light into electrical signals. The light receiving element OPD may convert the provided light (e.g., incident light) into electrons and holes, and may be to transmit the photogenerated electrons and holes to each corresponding electrode.

Figure 6:
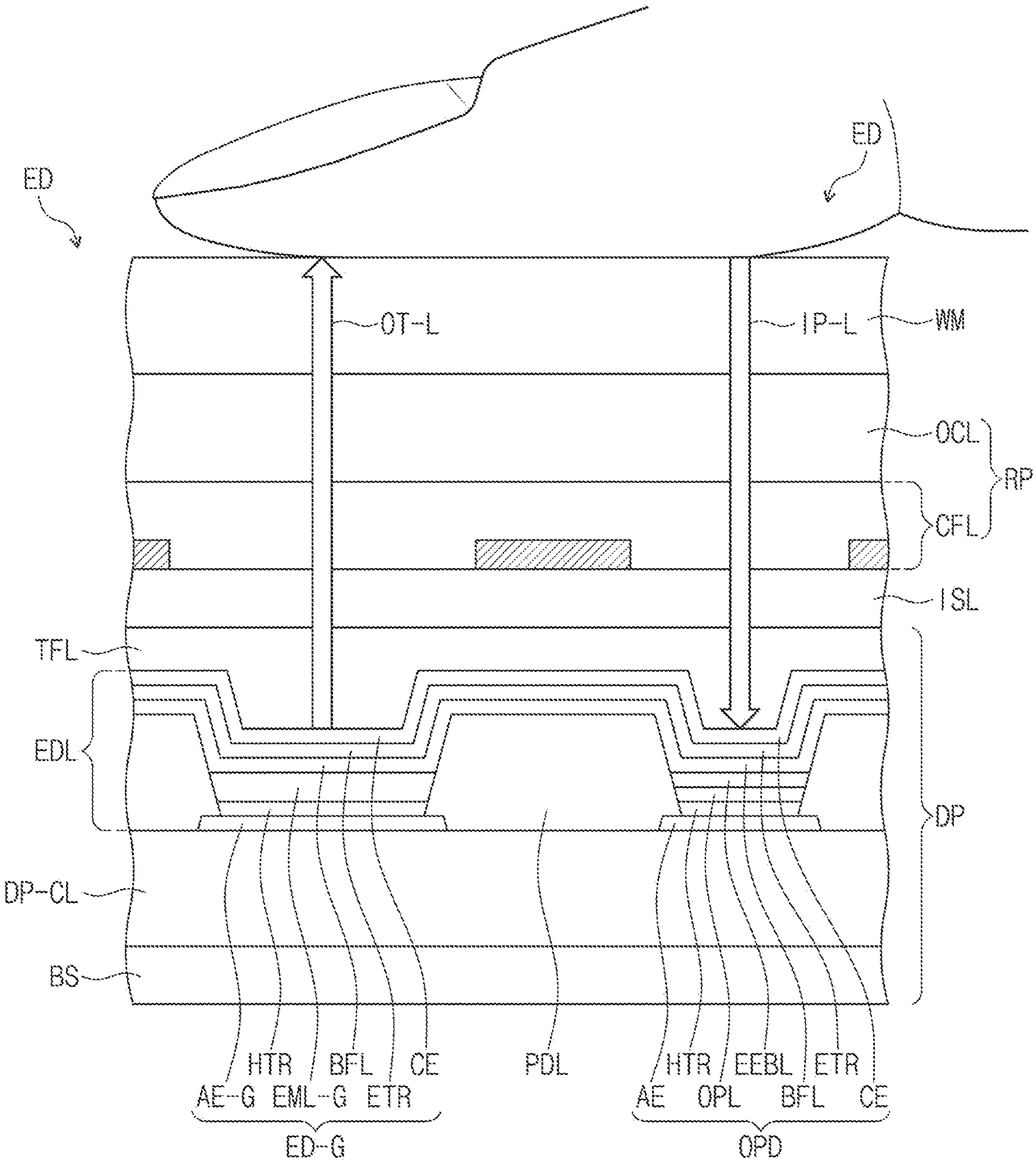
FIG. 6 is a cross-sectional view showing an electronic device according to one or more embodiments of the present disclosure.

FIG. 6 is a cross-sectional view showing a portion of an electronic device according to one or more embodiments. FIG. 6 schematically shows operation forms of a light emitting element and a light receiving element. Referring to FIG. 6, in the electronic device ED according to one or more embodiments, light OT-L emitted from the light emitting element ED-G included in the display element layer EDL may be reflected from external objects (e.g., a fingerprint FG in the present embodiment) and be incident to the light receiving element OPD included in the display element layer EDL as reflected light IP-L. The reflected light IP-L incident on the light receiving element OPD may be light in a visible light range. The light receiving device OPD may receive the incident light and convert the received light into electrical signals to recognize external inputs, thereby changing a driving state of the electronic device ED.

For example, light emitted from the light emitting element ED-G and reflected from external objects may be incident on the light receiving element OPD, and the incident light generates electrons and holes in the light receiving layer OPL of the light receiving element OPD, and then the photogenerated electrons and holes are transmitted to each corresponding electrode AE and CE. Accordingly, optical signals are converted into electrical signals.

In one or more embodiments, the electron extraction layer EEBL may be disposed above (e.g., on) the light receiving layer OPL. For example, in some embodiments, the electron extraction layer EEBL may be directly disposed on the light receiving layer OPL. The light receiving element OPD according to one or more embodiments may include the electron extraction layer EEBL to facilitate movement of electrons formed in the light receiving layer OPL. For example, the light receiving element OPD according to one or more embodiments may include the electron extraction layer EEBL disposed between the light receiving layer OPL and the electron transport region ETR to exhibit an increase in photoelectric efficiency that indicates a conversion efficiency of the received light into electrical signals.

In one or more embodiments, the electron extraction layer EEBL may be included in the light receiving element OPD and may not be included in the light emitting elements ED-R, ED-G, and ED-B. The electron extraction layer EEBL may non-overlap (not overlap) the emission layers EML-R, EML-G, and EML-B.

In one or more embodiments, the electron extraction layer EEBL may be disposed above (e.g., on) the light receiving layer OPL, and may include an n-dopant material. In one or more embodiments, the electron extraction layer EEBL may be directly disposed on the light receiving layer OPL. The electron extraction layer EEBL may be formed of a single layer or a plurality of layers. For example, the electron extraction layer EEBL may have a structure having a single layer including an n-dopant material or a structure in which a plurality of different layers including an n-dopant material are stacked.

The n-dopant material included in the electron extraction layer EEBL may include a metal having a work function of 3.0 eV or less. In some embodiments, the electron extraction layer EEBL may further include an organic compound having a chelate bond with a metal having a work function of 3.0 eV or less. For example, the electron extraction layer EEBL may include an organometallic compound including a metal having a work function of 3.0 eV or less.

For example, in one or more embodiments, the organic compound having a chelate bond with a metal having a work function of 3.0 eV or less may be represented by any one selected from among compounds of Compound Group 2 and compounds of Compound Group 3.

Compound Group 2

1

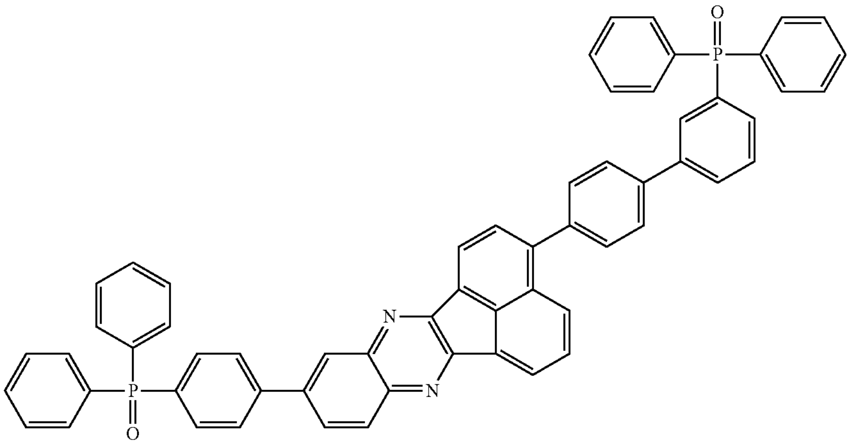

2

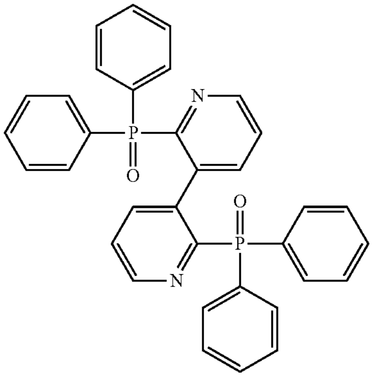

3

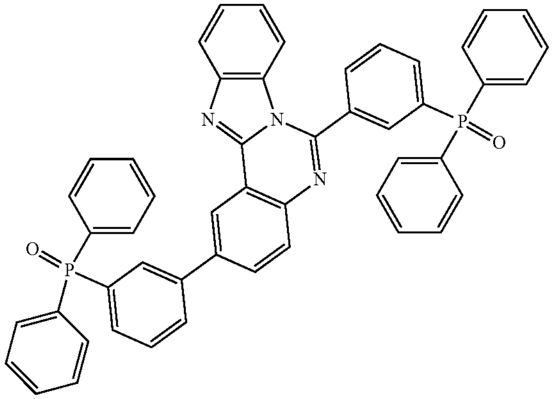

-continued
4
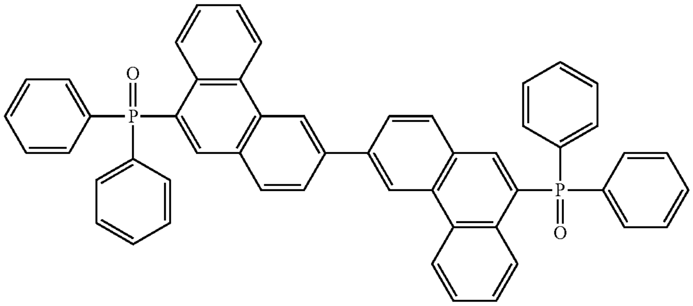
5
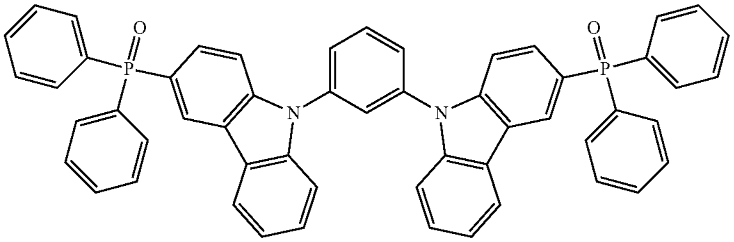
6
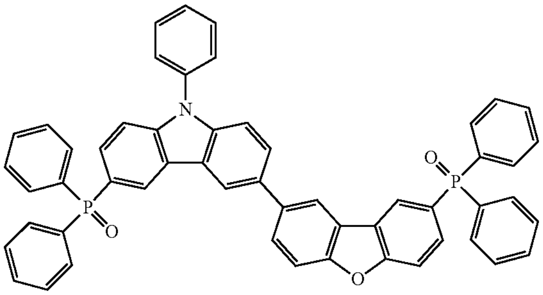
7
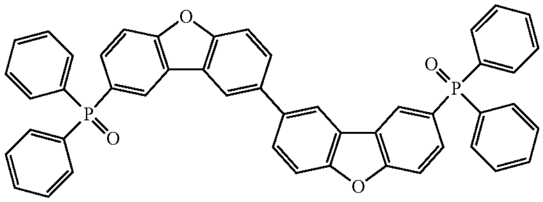
8
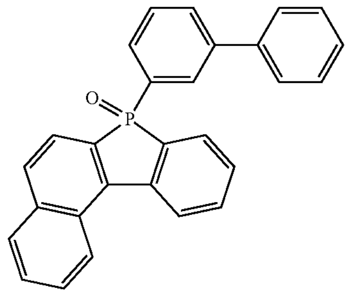
9
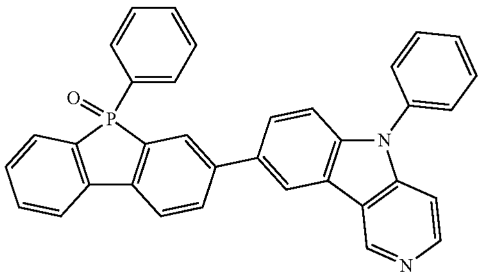
10
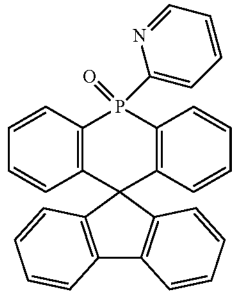
11
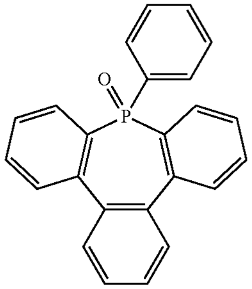

-continued
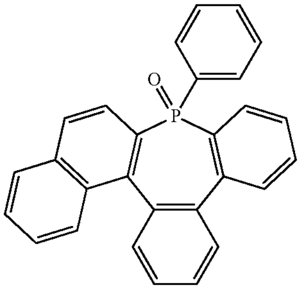
12
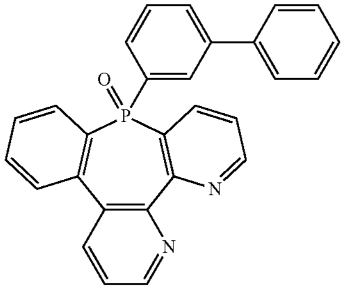
13
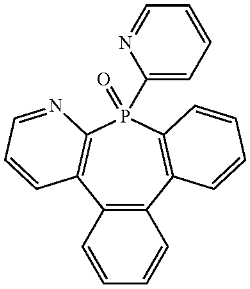
14
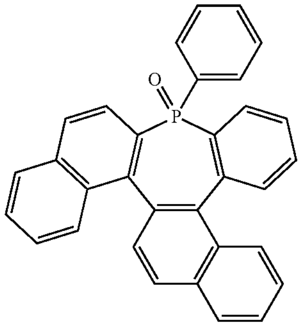
15
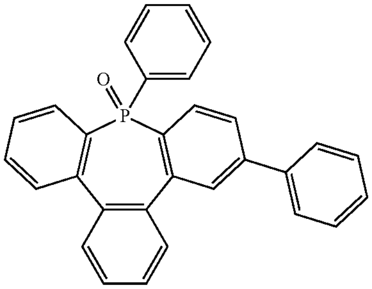
16
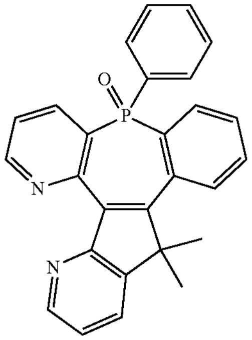
17
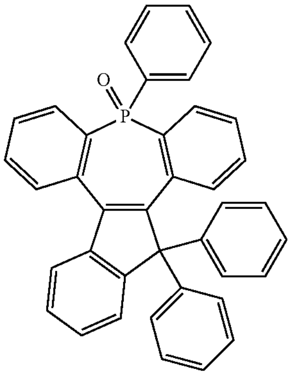
18
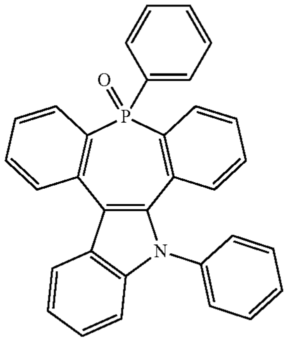
19

Compound Group 3

(20)

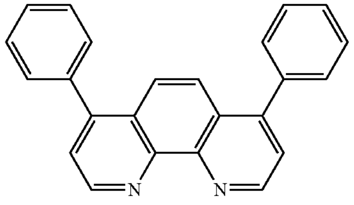

(21)

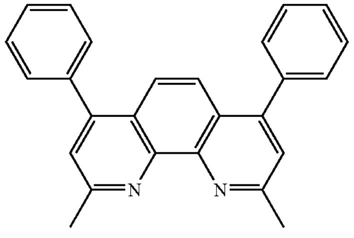

(22)

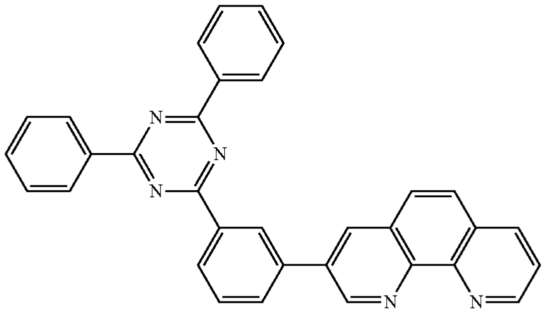

(23)

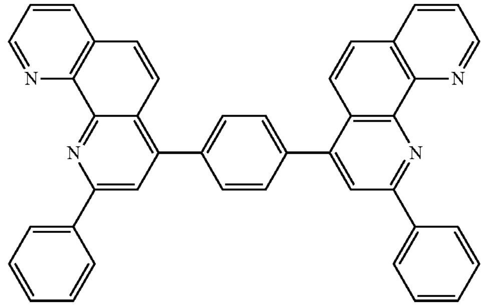

(24)

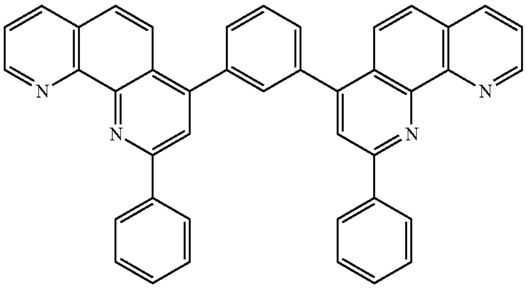

-continued (25)

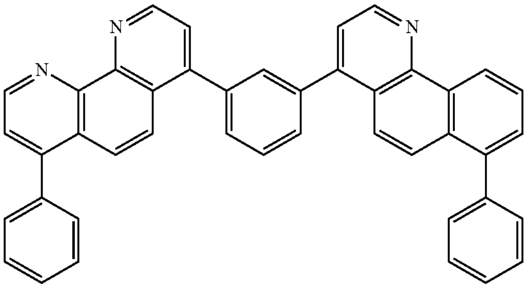

(26)

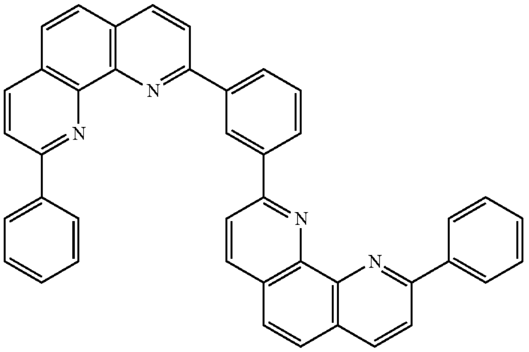

(27)

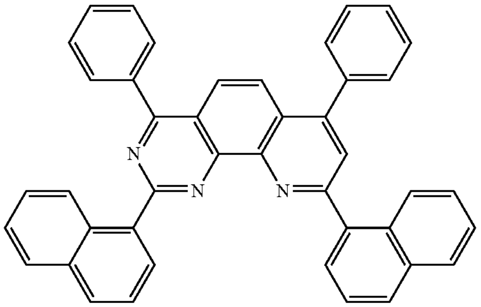

(28)

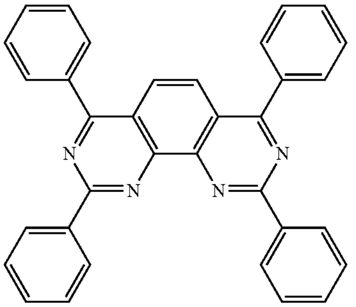

.

In one or more embodiments, a doping concentration of the metal with respect to the organic compound may be about 0.5 vol % to about 10 vol %. When the doping concentration of the metal with respect to the organic compound satisfies about 0.5 vol % to about 10 vol %, it may facilitate movement of electrons transferred from the electron extraction layer EEBL including the metal to the electron transport region ETR. For example, in some embodiments, the doping concentration of the metal with respect to the organic compound may be 0.1 vol % to 5 vol %. However, this is merely presented as an example, and embodiments of the present disclosure are not limited thereto.

In one or more embodiments, the n-dopant material included in the electron extraction layer EEBL may include lithium (Li), ytterbium (Yb), magnesium (Mg), silver (Ag), calcium (Ca), and/or sodium (Na). For example, in some embodiments, the electron extraction layer EEBL may include Li, Yb, Mg, Ag, Ca, or Na, or a compound including these elements as an n-dopant material. In some embodiments, for example, a compound including Li may include LiF or 8-hydroxyquinolinolato-lithium (LiQ), but embodiments of the present disclosure are not limited thereto. In some embodiments, materials included in the electron extraction layer EEBL are not limited to the above-described materials, and in addition to the above-described materials, a metal satisfying the condition where the work function is 3.0 eV or less may be included.

In the electronic device of one or more embodiments, the light receiving element OPD may include the electron extraction layer EEBL above/on the light receiving layer OPL, and include a metal having a work function of 3.0 eV or less in the electron extraction layer EEBL to facilitate the transfer of electrons generated in the light receiving layer OPL to the electron transport region ETR. For example, in one or more embodiments, the electron extraction layer EEBL may include the metal having a work function of 3.0 eV or less to make holes in the electron transport region ETR adjacent to the electron extraction layer EEBL move to the electron extraction layer EEBL, thereby facilitating the movement of electrons transferred to the electron transport region ETR through the electron extraction layer EEBL. Consequently, the light receiving element OPD according to one or more embodiments of the present disclosure may exhibit excellent or suitable photoelectric efficiency.

Referring to FIG. 5, the electronic device according to one or more embodiments may include a base layer BS in the display module DM. The base layer BS may be a member providing a base surface on which the display element layer EDL is disposed. The base layer BS may be a glass substrate, a metal substrate, a polymer substrate, and/or the like. However, embodiments of the present disclosure are not limited thereto, and the base layer BS may be an inorganic layer, an organic layer, or a composite material layer.

In one or more embodiments, the base layer BS may have a multi-layer structure. For example, in some embodiments, the base layer BS may have a three-layer structure of a synthetic resin layer, an adhesive layer, and a synthetic resin layer. In some embodiments, the synthetic resin layer may include a polyimide-based resin. In some embodiments, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In some embodiments, as described herein, a "~~based" resin may be considered as including a functional group of "~~".

The circuit layer DP-CL is disposed on the base layer BL. The circuit layer DP-CL may include an insulating layer, a semiconductor pattern, a conductive pattern, a signal line, and/or the like. The insulating layer, the semiconductor layer, and the conductive layer are formed on the base layer BS through coating or deposition, and subsequently, the insulating layer, the semiconductor layer, and the conductive layer may be selectively patterned through multiple times of a photolithography process. Then, the semiconductor pattern, the conductive pattern, and the signal line included in the circuit layer DP-CL may be formed.

The display element layer EDL may be disposed on the circuit layer DP-CL. The display element layer EDL may include light emitting elements ED-ft ED-G, and ED-B and a light receiving element OPD. For example, in one or more embodiments, the light emitting elements ED-ft ED-G, and ED-B included in the display element layer EDL may include an organic light emitting element, a quantum dot light emitting element, a micro LED light emitting element, and/or a nano LED light emitting element. However, embodiments of the present disclosure are not limited thereto, and the light emitting elements ED-ft ED-G, and ED-B may include one or more suitable embodiments including light emitting elements as long as light is generated or an amount of light is controlled or selected according to electrical signals.

In some embodiments, the light receiving element OPD may be a light sensor that receives and recognizes light reflected by external objects. In some embodiments, the light receiving element OPD may be a light sensor that recognizes light in a visible light range, which is reflected by external objects. In one or more embodiments, the light receiving element OPD may be a biometric sensor that recognizes light reflected from a user's body part, such as fingerprint and/or vein, and converts light signals into electrical signals.

The display element layer EDL may include the pixel defining film PDL in which openings OP-E and OP-I are defined, and the light emitting elements ED-ft ED-G, and ED-B and the light receiving device OPD may be separated and distinguished with respect to the pixel defining layer PDL. In the pixel defining film PDL, a first opening OP-E in which components of the light emitting elements ED-ft ED-G, and ED-B are disposed and a second opening OP-I in which components of the light receiving element OPD are disposed.

The pixel defining film PDL may be disposed on the base layer BS. In one or more embodiments, the pixel defining film PDL may be disposed on the circuit layer DP-CL, and may expose a portion of upper surfaces of first electrodes AE-R, AE-G, AE-B, and AE in the openings OP-E and OP-I. In the present embodiments, the light emitting regions PXA-R, PXA-G, and PXA-B and the light receiving region IPA are defined to correspond to the regions of the first electrodes AE-R, AE-G, AE-B, and AE exposed in the openings OP-E and OP-I, respectively.

In one or more embodiments, the pixel defining film PDL may be formed of a polymer resin. For example, in some embodiments, the pixel defining films PDL may be formed including a polyacrylate-based resin and/or a polyimide-based resin. In some embodiments, the pixel defining films PDL may be formed by further including an inorganic material in addition to the polymer resin. In some embodiments, the pixel defining film PDL may be formed including a light absorbing material, or may be formed including a black pigment or a black dye. The pixel defining film PDL formed including a black pigment or a black dye may implement a black pixel defining film. When forming the pixel defining films PDL, carbon black may be utilized as a black pigment or a black dye, but embodiments of the present disclosure are not limited thereto.

In one or more embodiments, the pixel defining films PDL may be formed of an inorganic material. For example, in some embodiments, the pixel defining film PDL may be formed including silicon nitride ($SiN_x$), silicon oxide ($SiO_x$), silicon oxide ($SiO_xN_y$), and/or the like.

The light emitting elements ED-ft ED-G, and ED-B may include first electrodes AE-R, AE-G, and AE-B, respectively, a second electrode (e.g., a common electrode) CE, and emission layers EML-R, EML-G, and EML-B, respectively. The first electrodes AE-R, AE-G, and AE-B may be exposed in the first opening OP-E. In the present disclosure, the first electrodes AE-R, AE-G, and AE-B respectively forming the light emitting elements ED-ft ED-G, and ED-B may be referred to as light emitting electrodes.

In one or more embodiments, the display element layer EDL may include a red light emitting element ED-R disposed to correspond to the red light emitting region PXA-R and emitting red light, a green light emitting element ED-G disposed to correspond to the green light emitting region PXA-G and emitting green light, and a blue light emitting element ED-B disposed to correspond to the blue light emitting region PXA-B and emitting blue light. The red light emitting element ED-R may include a first electrode AE-R and a second electrode CE facing each other, and a red emission layer EML-R disposed between the first electrode AE-R and the second electrode CE. The green light emitting element ED-G may include a first electrode AE-G and a second electrode CE facing each other, and a green emission layer EML-G disposed between the first electrode AE-G and the second electrode CE, and the blue light emitting element ED-B may include a first electrode AE-B and a second electrode CE facing each other, and a blue emission layer EML-B disposed between the first electrode AE-B and the second electrode CE.

The light receiving element OPD may include a first electrode AE, a second electrode CE, a light receiving layer OPL, and an electron extraction layer EEBL. The first electrode AE may be exposed in the second opening OP-I. In the present disclosure, the first electrode AE forming the light receiving element OPD may be referred to as a light receiving electrode.

Figure 7A:
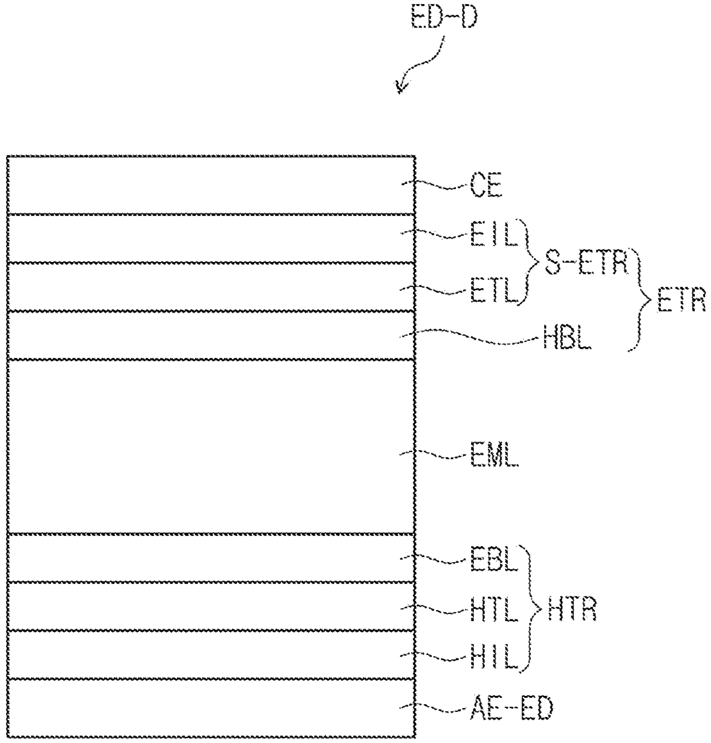
FIG. 7A is a cross-sectional view showing a light emitting element according to one or more embodiments of the present disclosure.
Figure 7B:
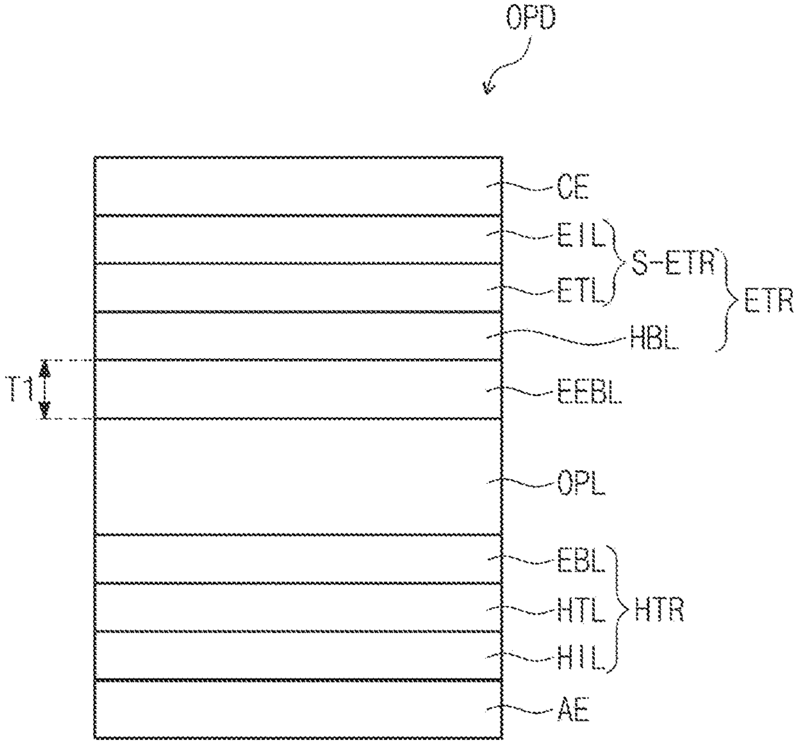
FIG. 7B is a cross-sectional view showing a light receiving element according to one or more embodiments of the present disclosure.

FIGS. 7A and 7B respectively show cross-sections of a light emitting element and a light receiving element as an example. FIG. 7A is a cross-sectional view showing a light emitting element according to one or more embodiments, and FIG. 7B is a cross-sectional view showing a light receiving element according to one or more embodiments.

A light emitting element ED-D according to one or more embodiments shown in FIG. 7A is shown to represent each of the light emitting elements ED-ft ED-G, and ED-B in FIG. 5. Each of the light emitting elements ED-ft ED-G, and ED-B shown in FIG. 5 is different only in the configuration of an emission layer from the configuration of the light emitting element ED-D shown in FIG. 7A.

Referring to FIG. 7A, the light emitting element ED-D according to one or more embodiments may include a first electrode AE-ED, a hole transport region HTR, an emission layer EML, an electron transport region ETR, and a second electrode CE, which are sequentially stacked (e.g., in the stated order). The hole transport region HTR may include a hole injection layer HIL, a hole transport layer HTL, and an electron blocking layer EBL, which are sequentially stacked (e.g., in the stated order). The electron transport region ETR may include a hole blocking layer EBL, an electron transport layer ETL, and an electron injection layer EIL.

Referring to FIG. 7B, the light receiving element OPD according to one or more embodiments may include a first electrode AE, a hole transport region HTR, a light receiving layer OPL, an electron extraction layer EEBL, an electron transport region ETR, and a second electrode CE, which are sequentially stacked (e.g., in the stated order). The hole transport region HTR may include a hole injection layer HIL, a hole transport layer HTL, and an electron blocking layer EBL, which are sequentially stacked (e.g., in the stated order). The electron transport region ETR may include a hole blocking layer HBL, an electron injection layer EIL, and an electron transport layer ETL, which are sequentially stacked (e.g., in the stated order). The electron extraction layer EEBL may be disposed between the light receiving layer OPL and the hole blocking layer HBL.

In some embodiments, referring to FIGS. 5, 7A, and 7B together, the hole transport region HTR included in the light emitting element ED-D and the hole transport region HTR included in the light receiving element OPD may be formed of the same material. In some embodiments, the hole transport region HTR may be provided as a single layer in the light emitting element ED-D and the light receiving element OPD.

The electron transport region ETR included in the light emitting element ED-D and the electron transport region ETR included in the light receiving element OPD may be formed of the same material. In some embodiments, the electron transport region ETR may be provided as a single layer in the light emitting element ED-D and the light receiving element OPD. For example, the hole blocking layer HBL may be provided as a single layer in the light emitting element ED-D and the light receiving element OPD.

In the light emitting element ED-D and the light receiving element OPD shown in FIGS. 7A and 7B, the first electrodes AE-ED and AE may be formed of a metal material, a metal alloy, or a conductive compound. The first electrodes AE-ED and AE may be an anode or a cathode. However, embodiments of the present disclosure are not limited thereto. In one or more embodiments, the first electrodes AE-ED and AE may be pixel electrodes or sensing electrodes. The first electrodes AE-ED and AE may be transmissive electrodes, transflective electrodes, or reflective electrodes. In one or more embodiments, when the first electrodes AE-ED and AE are transmissive electrodes, the first electrodes AE-ED and AE may include a transparent metal oxide such as indium tin oxide (ITO), indium zinc oxide (IZO), zinc oxide (ZnO), and/or indium tin zinc oxide (ITZO). In one or more embodiments, when the first electrodes AE-ED and AE are transflective electrodes or reflective electrodes, the first electrodes AE-ED and AE may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), tungsten (W), a compound thereof, or a mixture thereof (e.g., a mixture of Ag and Mg).

The second electrode CE may be a common electrode. The second electrode CE may be a cathode or an anode but embodiments of the present disclosure are not limited thereto. For example, when the first electrodes AE-ED and AE are anodes, the second electrode EL2 may be a cathode, and when the first electrodes AE-ED and AE are cathodes, the second electrode EL2 may be an anode.

The second electrode CE may be a transmissive electrode, a transflective electrode, or a reflective electrode. When the second electrode CE is a transmissive electrode, the second electrode CE may be formed of a transparent metal oxide, for example, indium tin oxide (ITO), indium zinc oxide (IZO), zinc oxide (ZnO), indium tin zinc oxide (ITZO), and/or the like. When the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgYb).

In some embodiments, the first electrodes AE-ED and AE included in the light emitting element ED-D and the light receiving element OPD, respectively, according to one or more embodiments may be transflective electrodes or reflective electrodes, and the second electrode CE may be a transmissive electrode or a transflective electrode. For example, in one or more embodiments, when the transmissive or transflective second electrode CE is included, light reflected from external objects may be easily transmitted to the light receiving element OPD.

The hole transport region HTR may have a single layer formed of a single material, a single layer formed of a plurality of different materials, or a multilayer structure having a plurality of layers formed of a plurality of different materials. For example, in some embodiments, the hole transport region HTR may be provided as a single layer instead of being divided into a plurality of layers.

In one or more embodiments, the hole transport region HTR may further include at least one of a hole buffer layer or a light emitting auxiliary layer.

The hole injection layer HIL may include, for example, a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f:2',3'-h] quinoxaline-2,3,6,7,10,11-hexacarbonitrile (HAT-CN), and/or the like.

For example, in one or more embodiments, the hole transport layer HTL may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), and/or the like.

However, embodiments of the present disclosure are not limited thereto, and the hole injection layer HIL and the hole transport layer HTL may include suitable hole injection layer materials or suitable hole transport layer materials in the art in addition to the above-described materials.

In the light emitting element ED-D, the emission layer EML may be provided on the hole transport region HTR. The emission layer EML may have a single layer formed of a single material, a single layer formed of a plurality of different materials, or a multilayer structure having a plurality of layers formed of a plurality of different materials.

In the light emitting element ED-D according to one or more embodiments, the emission layer EML may include an organic light emitting material or a quantum dot material. For example, in some embodiments, the emission layer EML may include, as an organic light emitting material, an anthracene derivative, a pyrene derivative, a fluoranthene derivative, a chrysene derivative, a dihydrobenzanthracene derivative, or a triphenylene derivative.

In some embodiments, in the light emitting element ED-D, the emission layer EL may include a host and a dopant. The emission layer EML may include, as a dopant material, an organic fluorescent dopant material, an organic phosphorescent dopant material, a thermally activated delayed fluorescent dopant material, or a phosphorescent dopant material of an organometallic complex.

In some embodiments, the emission layer EML may include, as a host material, at least one selected from among bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b, d]furan (PPF), 4,4',4"-tris(carbazol-9-yl)-triphenylamine (TCTA), and 1,3,5-tris(1-phenyl-1H-benzo[d]imidazol-2-yl)benzene (TPBi). However, embodiments of the present disclosure are not limited thereto, and for example, tris(8-hydroxyquinolino)aluminum ($Alq_3$), 4,4'-bis(N-carbazolyl)-1,1-biphenyl (CBP), poly(N-vinylcarbazole) (PVK), 9,10-di(naphthalen-2-yl)anthracene (ADN), 4,4',4"-tris (carbazol-9-yl)-triphenylamine (TCTA), 1,3,5-tris(N-phenylbenzimidazol-2-yl)benzene (TPBi), 2-tert-butyl-9,10-di (naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), and/or the like may be included.

In one or more embodiments, the emission layer EML may include, as a suitable dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), and/or the like.

In one or more embodiments, the emission layer EML may include, as a suitable phosphorescent dopant material, for example, a metal complex including iridium (Ir), platinum (Pt), osmium (Os), gold (Au), titanium (Ti), zirconium (Zr), hafnium (Hf), europium (Eu), terbium (Tb), or thulium (Tm). In some embodiments, iridium(III) bis(4,6-difluorophenylpyridinato-N,C2') (Flrpic), bis(2,4-difluorophenylpyridinato)-tetrakis(1-pyrazolyl)borate iridium(III) (Fir6), or platinum octaethyl porphyrin (PtOEP) may be utilized as a phosphorescent dopant. However, embodiments of the present disclosure are not limited thereto.

Light emitting materials may vary according to the emission layers EML-R, EML-G, and EML-B of the light emitting elements ED-ft ED-G, and ED-B shown in FIG. 5. For example, dopant materials may vary according to the emission layers EML-R, EML-G, and EML-B.

Referring to FIG. 7B, the light receiving element OPD may include the light receiving layer OPL disposed on the hole transport region HTR. The light receiving layer OPL may include a light receiving material that receives light and converts the light into electrical signals.

In one or more embodiments, the light receiving layer OPL may include an organic light receiving material. In some embodiments, the light receiving layer OPL may include a donor compound and an acceptor compound. For example, in some embodiments, the light receiving layer OPL may include, as an acceptor compound, a fullerene derivative, a perylene tetracarboxylic diimide (PTCDI) derivative, a perylene tetracarboxylic dianhydride (PTCDA)

derivative, a 1,4,5,8-naphthalenetetracarboxylic dianhydride (NTCDA) derivative, and/or a naphthalenetetracarboxylic diimide (NTCDI) derivative.

In one or more embodiments, the light receiving layer OPL may include a donor compound represented by Formula 1.

Formula 1

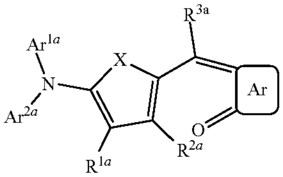

In Formula 1, X may be O, S, Se, Te, SO, $SO_2$, CRbRc, or SiRdRe. In Formula 1, Ar may be a substituted or unsubstituted arylene group having 6 to 30 ring-forming carbon atoms, or a substituted or unsubstituted heterocyclic group having 3 to 30 ring-forming carbon atoms. $Ar^{1a}$ and $Ar^{2a}$ may each independently be a substituted or unsubstituted aryl group having 6 to 30 ring-forming carbon atoms, or a substituted or unsubstituted heteroaryl group having 3 to 30 ring-forming carbon atoms. In one or more embodiments, $Ar^{1a}$ and $Ar^{2a}$ may bond to each other to form a fused ring moiety (e.g., a carbazole group). $R^{1a}$ to $R^{3a}$ and Rb to Re may each independently be hydrogen, a halogen, a cyano group, a substituted or unsubstituted alkyl group having 1 to 10 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 6 to 30 ring-forming carbon atoms, and/or bonded to an adjacent group to form a ring.

In one or more embodiments, the light receiving layer OPL may include at least one selected from among compounds disclosed in Compound Group 1 as a donor compound. However, this is merely presented as an example, and embodiments of the present disclosure are not limited thereto.

Compound Group 1

1

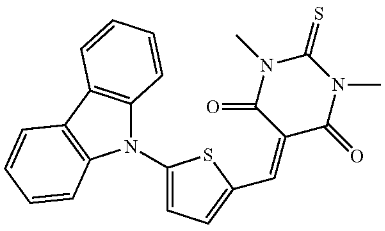

2

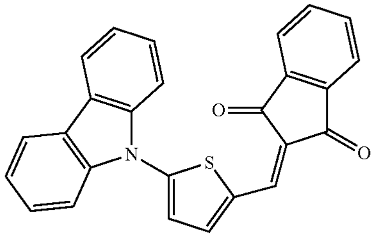

-continued

3

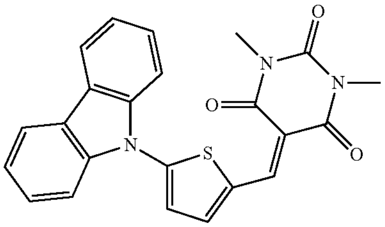

4

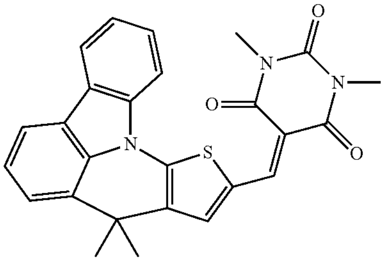

5

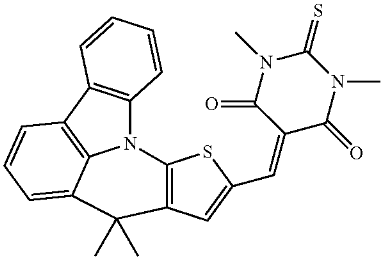

6

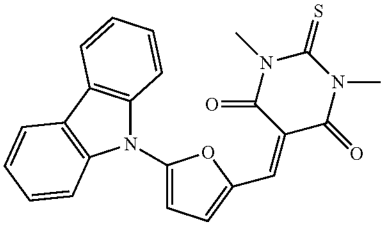

7

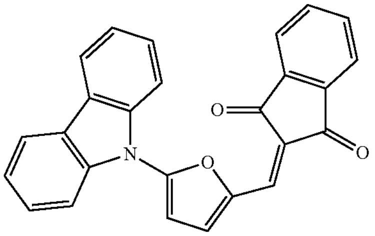

8

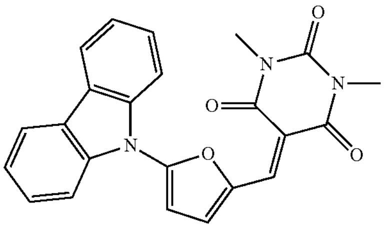

-continued

9

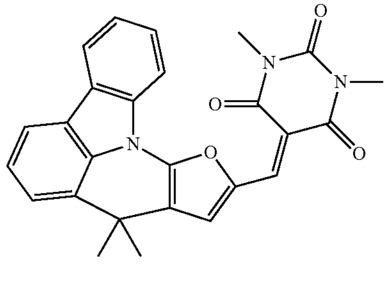

10

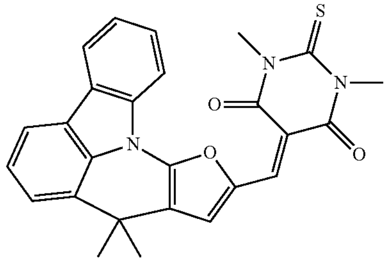

11

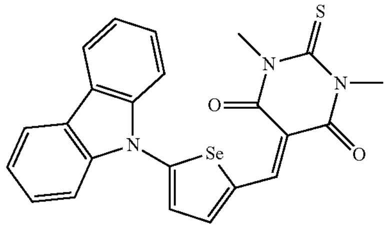

12

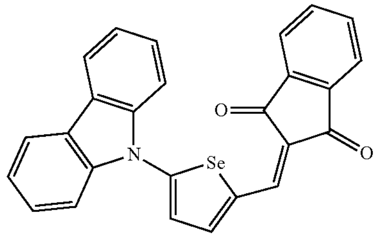

13

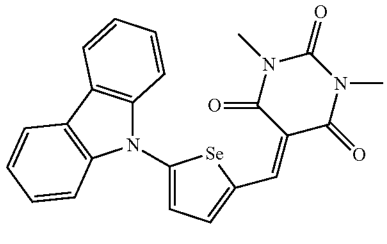

14

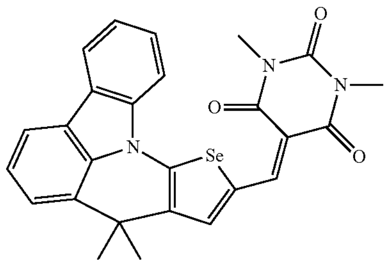

-continued

15

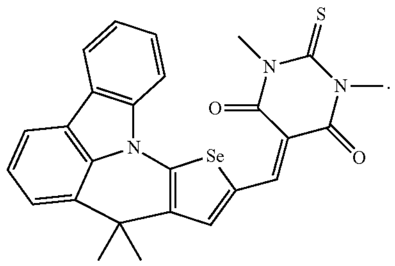

In some embodiments, in the light receiving element OPD, the light receiving layer OPL may include an organic polymer material as a light receiving material, and for example, the light receiving layer OPL may include a conjugated polymer. The light receiving layer OPL may include a thiophene-based conjugated polymer, a benzodithiophene-based conjugated polymer, a thieno[3,4-c]pyrrole-4,6-dione (TPD)-based conjugated polymer, a diketo-pyrrole-pyrrole (DPP)-based conjugated polymer, a benzothiadiazole (BT)-based conjugated polymer, and/or the like. However, embodiments of the present disclosure are not limited thereto.

In one or more embodiments, the electron extraction layer EEBL may have a thickness T1 of about 10 Å to about 100 Å. For example, in some embodiments, the electron extraction layer EEBL may have a thickness T1 of about 40 Å to about 60 Å. When the thickness T1 of the electron extraction layer EEBL is adjusted to about 10 Å to about 100 Å, electrons may be easily extracted from an acceptor compound of the light receiving layer OPL.

In one or more embodiments, the electron extraction layer EEBL may further include an acceptor compound included in the light receiving layer OPL. For example, in some embodiments, the electron extraction layer EEBL may further include a fullerene derivative, a perylene tetracarboxylic diimide (PTCDI) derivative, a perylene tetracarboxylic dianhydride (PTCDA) derivative, a 1,4,5,8-naphthalenetetracarboxylic dianhydride (NTCDA) derivative, and/or a naphthalenetetracarboxylic diimide (NTCDI) derivative.

In one or more embodiments, the electron transport region ETR including in the light emitting element ED-D and the light receiving element OPD may have a single layer formed of a single material, a single layer formed of a plurality of different materials, or a multi-layer structure including a plurality of layers formed of a plurality of different materials.

Referring to FIGS. 7A and 7B, the electron transport region ETR may include a hole blocking layer HBL, an electron injection layer EIL, and an electron transport layer ETL. In the light emitting element ED-D, the electron transport region ETR may be disposed on the emission layer EML, and in the light receiving element OPD, the electron transport region ETR may be disposed on the electron extraction layer EEBL.

In one or more embodiments, the hole blocking layer (HBL) may include a triazine-based compound. For example, the hole blocking layer HBL may include a triazine-based compound having a LUMO energy level of about 2.0 eV to about 2.5 eV and a HOMO energy level of about 5.0 eV to about 7.0 eV. The hole blocking layer EBL may include a 1,3,5-triazine compound represented by Formula ET-1.

Formula ET-1

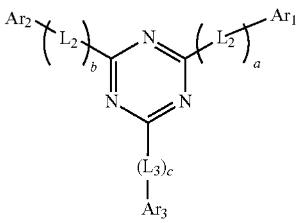

In Formula ET-1, Ari to Ara may each independently be hydrogen, deuterium, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer of 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a to c are an integer of 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

In some embodiments, the hole blocking layer EBL may include at least one selected from among compounds ET31 to ET37. However, this is merely presented as an example, and embodiments of the present disclosure are not limited thereto.

ET31

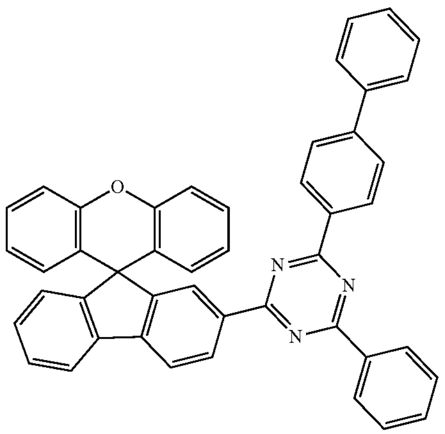

-continued

ET32

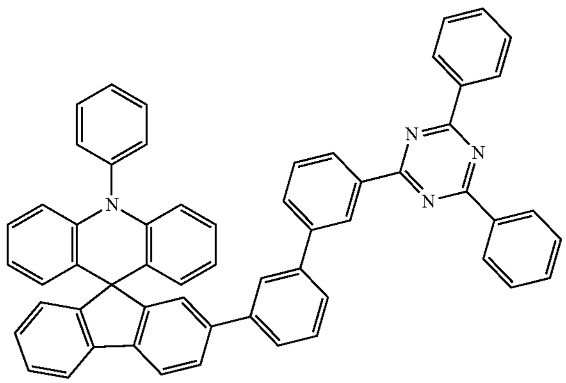

ET33

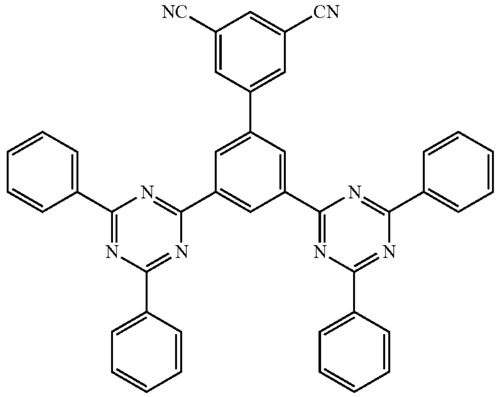

ET34

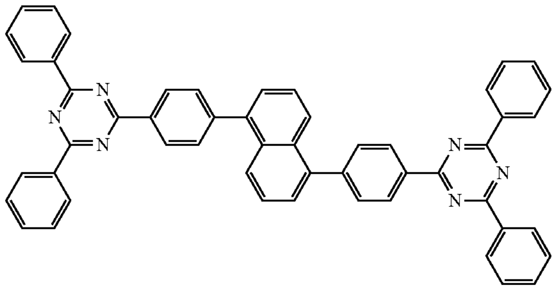

ET35

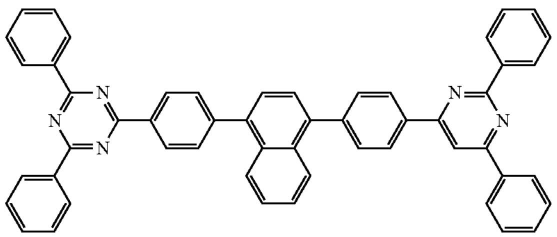

-continued

ET36

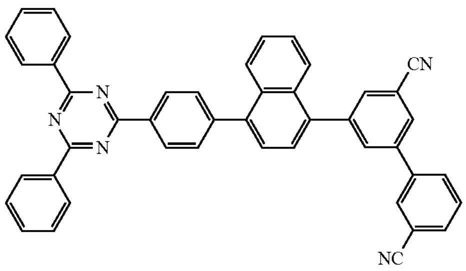

ET37

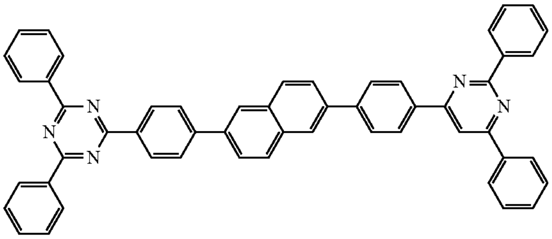

In one or more embodiments, the hole blocking layer HBL does not include an n-dopant material included in the electron extraction layer EEBL, and thus the hole blocking layer HBL and the electron extraction layer EEBL may be distinguished by a material.

In one or more embodiments, the electron transport layer ETL may further include an anthracene-based compound. However, embodiments of the present disclosure are not limited thereto, and the electron transport layer ETL may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate ($Bebq_2$), 9,10-di(naphthalen-2-yl) anthracene (ADN), 1,3-bis[3,5-di(pyridin-3-yl)phenyl] benzene (BmPyPhB), or a mixture thereof.

In the light receiving element OPD according to one or more embodiments, the electron transport layer ETL and the electron extraction layer EEBL may include different materials. For example, in the light receiving element OPD, materials forming the electron transport layer ETL and materials forming the electron extraction layer EEBL may be different. For example, the electron transport layer ETL may not include (e.g., may exclude) an or any n-dopant material included in the electron extraction layer EEBL.

In one or more embodiments, the electron injection layer EIL may include halogenated metals such as LiF, NaCl, CsF, RbCl, RbI, CuI, and Kl, lanthanide metals such as Yb, or co-deposition materials of a halogenated metal and a lanthanide metal. For example, in some embodiments, the electron injection layer EIL may include Kl:Yb, RbI:Yb, and/or the like as a co-deposition material. In some embodiments, for the electron injection layer EIL, a metal oxide such as $Li_2O$ and BaO, or Liq, and/or the like may be utilized, but embodiments of the present disclosure are limited thereto. The electron injection layers EIL may also be formed of a mixture material of an electron transport material and an insulating organo metal salt. The organo metal salt may be a material having an energy band gap of about 4 eV or greater. For example, the organo metal salt may include, for example, metal acetates, metal benzoates, metal acetoacetates, metal acetylacetonates, and/or metal stearates.

In one or more embodiments, the electron extraction layer EEBL may be a layer including an n-dopant material or a layer including an n-dopant material and an acceptor compound of the light receiving layer OPL. For example, the electron extraction layer EEBL may be a single material layer formed of a single material by including one selected from n-dopant materials, or a composite material layer including an acceptor material and an n-dopant material.

Referring back to FIG. 5, the emission layers EML-R, EML-G, and EML-B of the light emitting elements ED-ft ED-G, and ED-B may each be formed separately in the first opening OP-E. In some embodiments, the light receiving layer OPL and the electron extraction layer EEBL of the light receiving element OPD may be formed separately in the second opening OP-I.

In one or more embodiments shown in FIG. 5, the electron transport region ETR may be disposed on the emission layers EML-R, EML-G, and EML-B of each of the light emitting elements ED-ft ED-G, and ED-B, or be disposed on the light receiving layer OPL of the light receiving element OPD, and may be provided by being separated by the pixel defining film PDL. In some embodiments, the electron transport region ETR may be provided as a single common layer. The electron transport region ETR may be provided as a common layer throughout the light emitting elements ED-ft ED-G, and ED-B and the light receiving element OPD. The electron transport region ETR may overlap all of the pixel defining film PDL, the emission layers EML-R, EML-G, and EML-B, and the light receiving layer OPL.

One or more embodiments may include an encapsulation layer TFL disposed on the light emitting elements ED-R, ED-G, and ED-B and the light receiving element OPD. The encapsulation layer TFL may include at least one inorganic layer and/or at least one organic layer. For example, in some embodiments, the encapsulation layer TFL may include an inorganic layer, an organic layer, and an inorganic layer which are sequentially stacked, but the layers forming the encapsulation layer TFL are not limited thereto.

The display module DM according to one or more embodiments may include an input sensing layer ISL disposed on the display panel DP. The input sensing layer ISL may be disposed on the display element layer EDL. The input sensing layer ISL may detect external inputs applied from the outside (e.g., from a user). The external inputs may be user inputs. The user inputs may include one or more suitable types (kinds) of external inputs such as a part of a user's body, light, heat, pen, or pressure.

In one or more embodiments, the input sensing layer ISL may be formed on the display panel DP through a roll-to-roll process. In these embodiments, the input sensing layer ISL may be expressed as being directly disposed on the display panel DP. Being directly disposed may indicate that a third component (e.g., an intervening component) is not disposed between the input sensing layer ISL and the display panel DP. For example, a separate adhesive member may not be disposed between the input sensing layer ISL and the display panel DP. For example, in some embodiments, the input sensing layer ISL may be directly disposed on the encapsulation layer TFL.

However, embodiments of the present disclosure are not limited thereto, in one or more embodiments, an adhesive member may be further disposed between the input sensing layer ISL and the display panel DP. The input sensing layer ISL may include a lower insulating layer IS-IL1, a first conductive layer IS-CL1, an interlayer insulating layer IS-IL2, a second conductive layer IS-CL2, and an upper insulating layer IS-IL3. In some embodiments of the present disclosure, at least one of the lower insulating layer IS-IL1 or the upper insulating layer IS-IL3 may not be provided.

Each of the first conductive layer IS-CL1 and the second conductive layer IS-CL2 may have a structure of a single layer or a structure of multiple layers stacked along the third direction axis DR3. In one or more embodiments, the conductive layer having the multi-layered structure may include at least two or more layers of transparent conductive layers and metal layers. In one or more embodiments, the conductive layer having the multi-layered structure may include metal layers having different metals. Each of the transparent conductive layers may include indium tin oxide (ITO), indium zinc oxide (IZO), zinc oxide (ZnO), indium tin zinc oxide (ITZO), PEDOT, a metal nano wire, and/or graphene. Each of the metal layers may include molybdenum, silver, titanium, copper, aluminum, and/or an alloy thereof. For example, in some embodiments, each of the first conductive layer IS-CL1 and the second conductive layer IS-CL2 may have a three-layered metal structure, such as, a three-layered structure of titanium/aluminum/titanium. A metal having relatively higher durability and lower reflectivity may be applied to upper/lower layers, and a metal having higher electrical conductivity may be applied to an inner layer.

In one or more embodiments, each of the first conductive layer IS-CL1 and the second conductive layer IS-CL2 may include a plurality of conductive patterns. Hereinafter, the first conductive layer IS-CL1 is described to include first conductive patterns, and the second conductive layer IS-CL2 is described to include second conductive patterns. Each of the first conductive patterns and the second conductive patterns may include sensing electrodes and signal lines connected thereto. The first conductive patterns and the second conductive patterns may be disposed to overlap a light blocking portion BM, which will be described later. The light blocking portion BM overlaps the first conductive layer IS-CL1 and the second conductive layer IS-CL2 to prevent or reduce reflection of external light by the first conductive layer IS-CL1 and the second conductive layer IS-CL2.

In one or more embodiments, each of the lower insulating layer IS-IL1, the interlayer insulating layer IS-IL2, and the upper insulating layer IS-IL3 may include an inorganic film and/or an organic film. In some embodiments, the lower insulating layer IS-IL1 and the interlayer insulating layer IS-IL2 may be inorganic films. In addition, the upper insulating layer IS-IL3 may include an organic film.

In one or more embodiments, the display module DM may include an anti-reflection member RP disposed on the display panel DP. In one or more embodiments, the anti-reflection member RP may be directly disposed on the input sensing layer ISL. The anti-reflection member RP may include a color filter layer CFL and an organic planarization layer OCL.

The color filter layer CFL may include filter portions CF and a light blocking portion BM. The filter portions CF may include a red filter portion CF-R, a green filter portion CF-G, and a blue filter portion CF-B. The red filter portion CF-R, the green filter portion CF-G, and the blue filter portion CF-B may each be a portion placed to correspond to a red light emitting region PXA-R, a green light emitting region PXA-G, and a blue light emitting region PXA-B, respectively. In some embodiments, the green filter portion CF-G may overlap the light receiving region IPA. For example, in some embodiments, the green filter portion CF-G may overlap the green light emitting element ED-G and the light receiving element OPD.

The red filter portion CF-R may be to transmit red light, the green filter portion CF-G may be to transmit green light, and the blue filter portion CF-B may be to transmit blue light. Each of the red filter portion CF-R, the green filter portion CF-G, and the blue filter portion CF-B may include a polymer photosensitive resin and a pigment and/or a dye. The red filter portion CF-R may include a red pigment and/or a red dye, the green filter portion CF-G may include a green pigment and/or a green dye, and the blue filter portion CF-B may include a blue pigment and/or a blue dye.

However, embodiments of the present disclosure are not limited thereto, and the blue filter portion CF-B may not include (e.g., may exclude) a or any pigment or a or any dye. The blue filter portion CF-B may include a polymer photosensitive resin, but may not include (e.g., may exclude) a or any pigment or a or any dye. The blue filter portion CF-B may be transparent. The blue filter portion CF-B may be formed of a transparent photosensitive resin.

The light blocking portion BM may be disposed on the input sensing layer ISL and overlap borders of neighboring filter portions CF. Edges of the neighboring filter portions CF may overlap one another. For example, the green filter portion CF-G and the red filter portion CF-R are disposed to overlap on the light blocking portion BM, or the green filter portion CF-G and the blue filter portion CF-B may be disposed to overlap on the light blocking portion BM. The light blocking portion BM may prevent or reduce light leakage, and separate borders between adjacent color filter portions CF-R, CF-G, and CF-R.

The light blocking portion BM may be a black matrix. The light blocking portion BM may include an organic pigment and/or an organic dye. The light blocking portion BM may be formed including an organic light blocking material and/or an inorganic light blocking material, both (e.g., simultaneously) including a black pigment and/or a black dye. In some embodiments, the light blocking portion BM may overlap the pixel defining film PDL. The light blocking portion BM may overlap the pixel defining film PDL placed between the light emitting regions PXA-R, PXA-G, and PXA-B and separate the light emitting regions PXA-R, PXA-G, and PXA-B from the light receiving region IPA.

The organic planarization layer OCL may be disposed on the color filter layer CFL. The organic planarization layer OCL may be disposed on the color filter layer CFL to protect the color filter portions CF-R, CF-G, and CF-B and to planarize an upper surface of the color filter layer CFL. The organic planarization layer OCL may include an organic material such as an acrylic resin or an epoxy resin.

The electronic device of one or more embodiments includes a light emitting element and a light receiving element in a display element layer, and includes an electron extraction layer disposed between a light receiving layer of the light receiving element and a hole blocking layer of the light receiving element and non-overlapping an emission layer of the light emitting element, and may thus exhibit increased efficiency of the light receiving element. For example, the electronic device of one or more embodiments may include an n-dopant material including a metal having a work function of 3.0 eV or less in the electron extraction layer to facilitate electron extraction from the light receiving layer. Accordingly, the electronic device of one or more embodiments may include the electron extraction layer, which is distinct from the hole blocking layer of an electron transport region, in the light receiving element to exhibit increased efficiency of the light receiving element.

Figure 8:
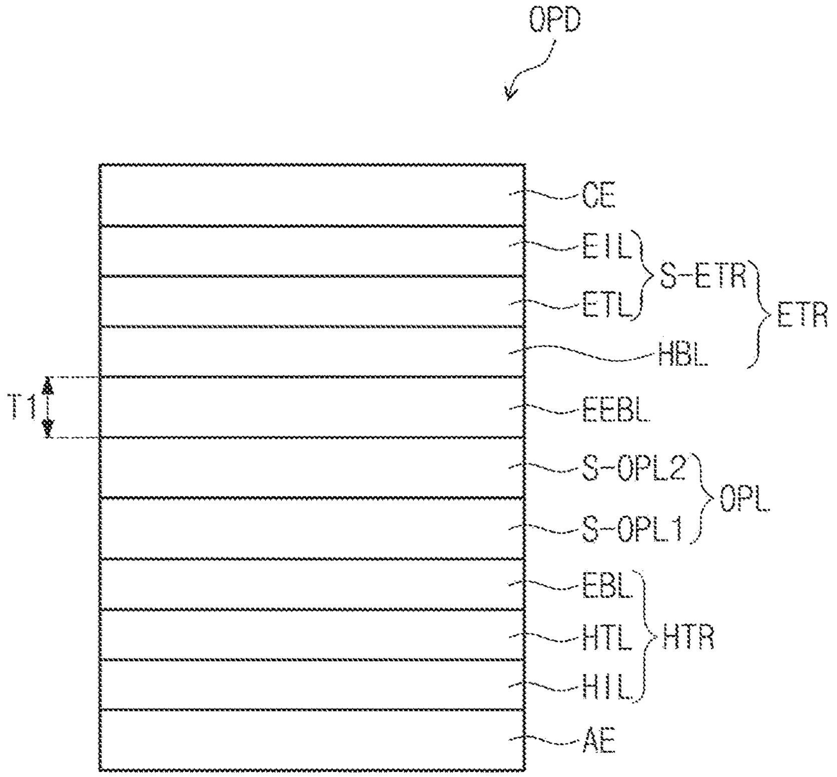
FIG. 8 is a cross-sectional view showing a light emitting element according to one or more embodiments of the present disclosure.
Figure 9:
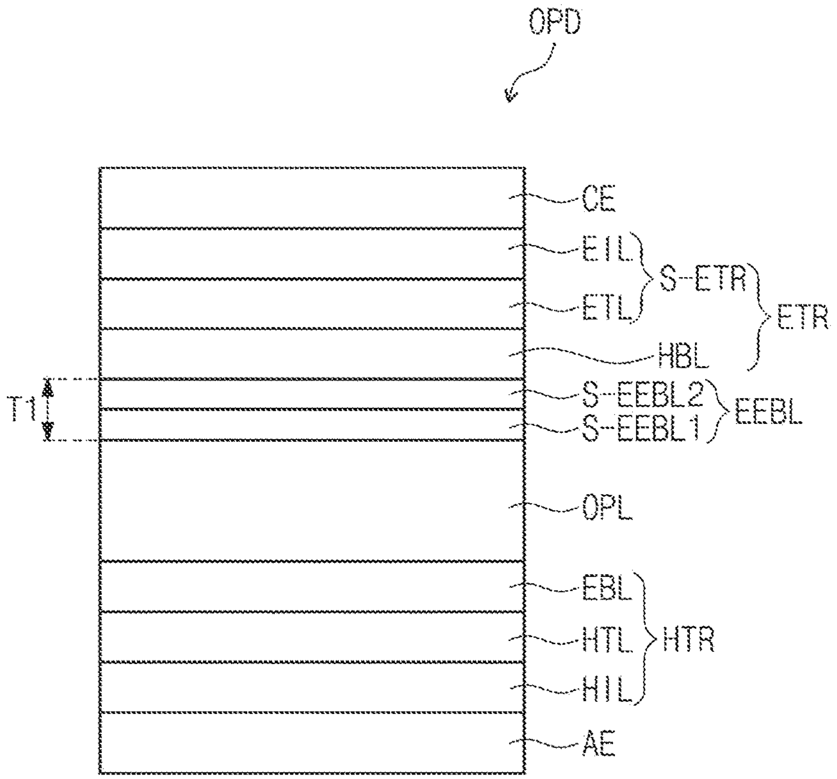
FIG. 9 is a cross-sectional view showing a light receiving element according to one or more embodiments of the present disclosure.
Figure 10:
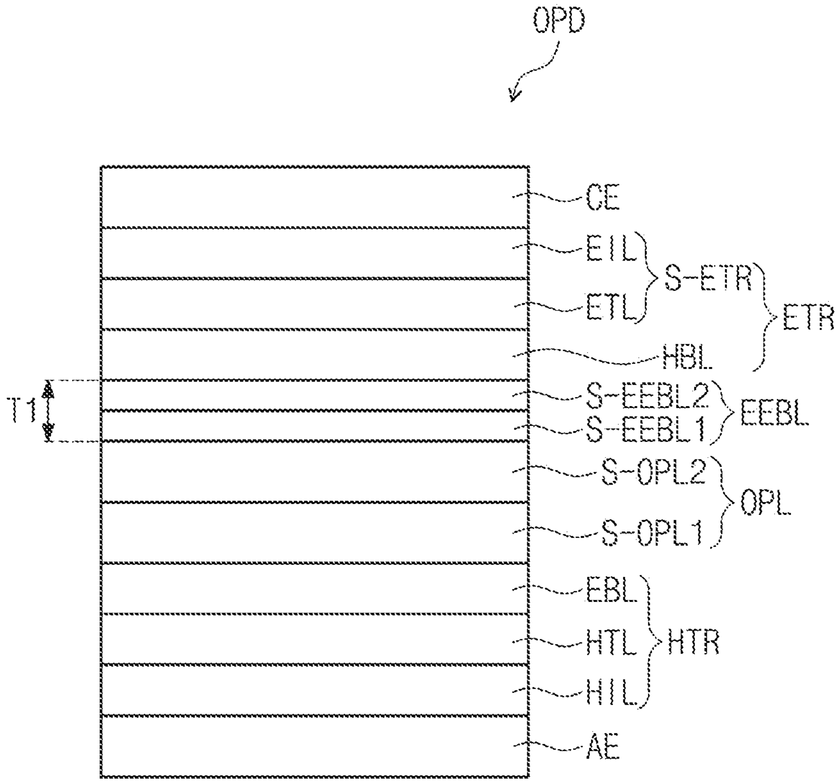
FIG. 10 is a cross-sectional view showing an electronic device according to one or more embodiments of the present disclosure.

FIG. 8 is a view schematically showing a cross-sectional view of a light receiving element according to one or more embodiments. FIG. 9 is a view schematically showing a cross-sectional view of a light receiving element according to one or more embodiments. FIG. 10 is a view schematically showing a cross-sectional view of a light receiving element according to one or more embodiments.

In describing embodiments with reference to FIGS. 8 to 10, content overlapping the one described above with reference to FIGS. 1 to 7B will not be described again, and the differences will be mainly described.

Unlike the light receiving element OPD shown in FIG. 7B, a light receiving element OPD according to one or more embodiments shown in FIG. 8 may include a light receiving layer OPL including a plurality of sub light receiving layers S-OPL1 and S-OPL2. Referring to FIG. 8, in one or more embodiments, the light receiving layer OPL may include a first sub light receiving layer S-OPL1 and a second sub light receiving layer S-OPL2. FIG. 8 shows that the light receiving layer OPL may include only the first sub light receiving layer S-OPL1 and the second sub light receiving layer S-OPL2, but embodiments of the present disclosure are not limited thereto. For example, in some embodiments, the light receiving layer OPL may include three or more sub light receiving layers.

The first sub light receiving layer S-OPL1 may be disposed between the electron blocking layer EBL and the electron extraction layer EEBL. The second sub light receiving layer S-OPL2 may be disposed between the first sub light receiving layer S-OPL1 and the electron extraction layer EEBL. The first sub light receiving layer S-OPL1 may include a donor compound and may not include (e.g., may exclude) an or any acceptor compound. The second sub light receiving layer S-OPL2 may not include (e.g., may exclude) a or any donor compound and may include an acceptor compound. However, this is merely presented as an example, and embodiments of the present disclosure are not limited thereto. For example, in some embodiments, the second sub light receiving layer S-OPL2 may include a donor compound and an acceptor compound.

In the light receiving element OPD according to one or more embodiments shown in FIG. 9, unlike the light receiving element shown in FIG. 7B, the electron extraction layer EEBL may include a plurality of sub electron extraction layers S-EEBL1 and S-EEBL2. Referring to FIG. 9, in one or more embodiments, the electron extraction layer EEBL may include a first sub electron extraction layer S-EEBL1 and a second sub electron extraction layer S-EEBL2. Although only two sub electron extraction layers are shown in FIG. 9, embodiments of the present disclosure are not limited thereto. For example, in some embodiments, the electron extraction layer EEBL may include three or more sub electron extraction layers.

The first sub electron extraction layer S-EEBL1 may include an acceptor compound included in the light receiving layer OPL. The second sub electron extraction layer S-EEBL2 may not include (e.g., may exclude) the acceptor compound included in the light receiving layer OPL.

Unlike the light receiving element shown in FIG. 7B, in the light receiving element OPD according to one or more embodiments shown in FIG. 10, the electron extraction layer EEBL may include a plurality of sub electron extraction layers S-EEBL1 and S-EEBL2, and the light receiving layer OPL may include a plurality of sub light receiving layers S-OPL1 and S-OPL2. Referring to FIG. 10, in one or more embodiments, the light receiving layer OPL may include a first sub light receiving layer S-OPL1 and a second sub light receiving layer S-OPL2. FIG. 10 shows that the light receiving layer OPL may include only the first sub light receiving layer S-OPL1 and the second sub light receiving layer S-OPL2, but embodiments of the present disclosure are not limited thereto. For example, in some embodiments, the light receiving layer OPL may include three or more sub light receiving layers.

The first sub light receiving layer S-OPL1 may be disposed between the electron blocking layer EBL and the electron extraction layer EEBL. The second sub light receiving layer S-OPL2 may be disposed between the first sub light receiving layer S-OPL1 and the electron extraction layer EEBL. The first sub light receiving layer S-OPL1 may include a donor compound and may not include (e.g., may exclude) an or any acceptor compound. The second sub light receiving layer S-OPL2 may not include (e.g., may exclude) a or any donor compound and may include an acceptor compound. However, this is merely presented as an example, and embodiments of the present disclosure are not limited thereto. For example, in some embodiments, the second sub light receiving layer S-OPL2 may include a donor compound and an acceptor compound.

In one or more embodiments, the electron extraction layer EEBL may include a first sub electron extraction layer S-EEBL1 and a second sub electron extraction layer S-EEBL2. Although only two sub electron extraction layers are shown in FIG. 10, embodiments of the present disclosure are not limited thereto. For example, in some embodiments, the electron extraction layer EEBL may include three or more sub electron extraction layers.

The first sub electron extraction layer S-EEBL1 may include an acceptor compound included in the light receiving layer OPL. The second sub electron extraction layer S-EEBL2 may not include (e.g., may exclude) the acceptor compound included in the light receiving layer OPL.

Figure 11:
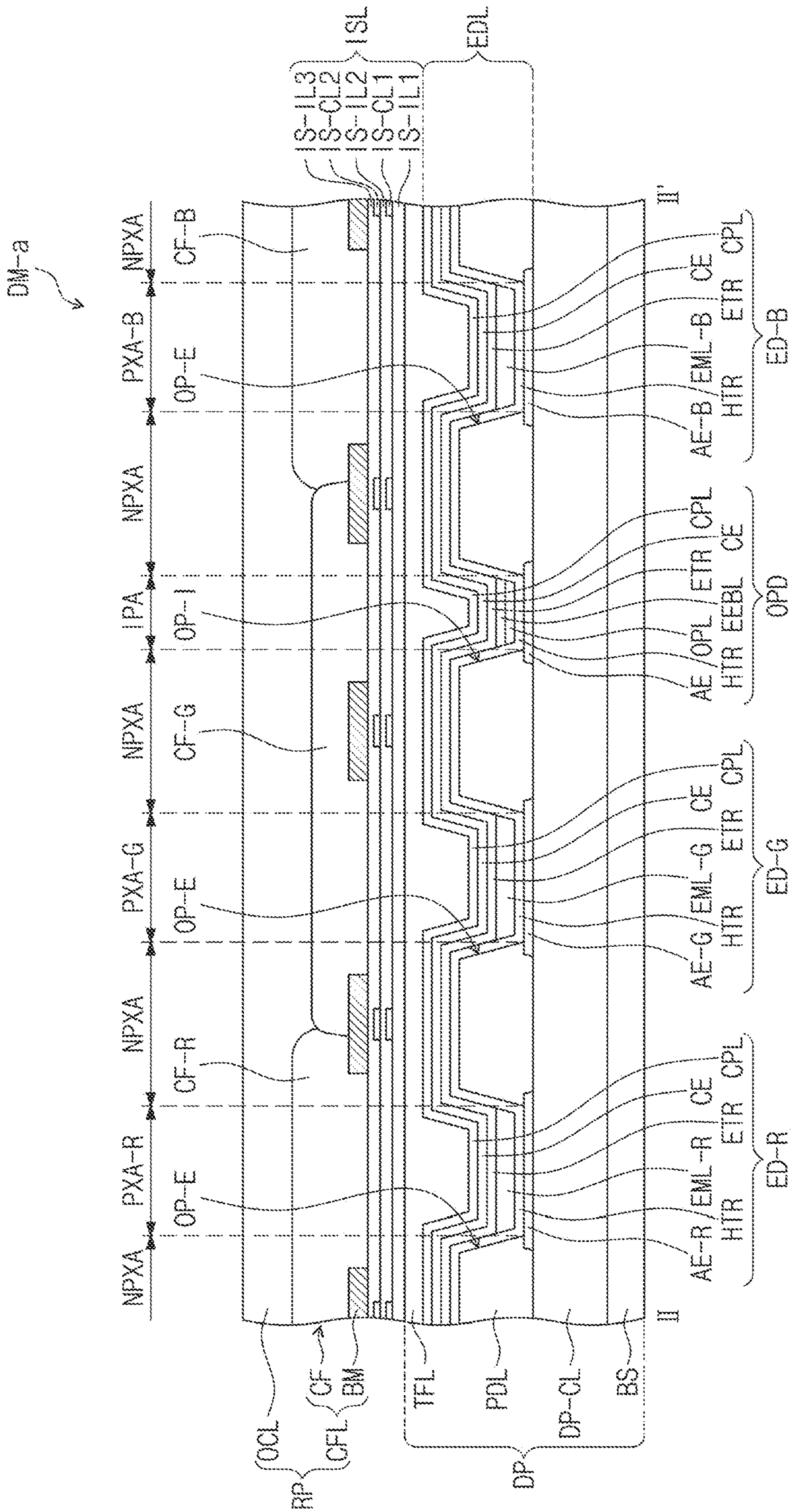
FIG. 11 is a cross-sectional view showing a portion of a display module according to one or more embodiments of the present disclosure.

FIG. 11 is a cross-sectional view showing a display module according to one or more embodiments. Compared with the display module DM according to one or more embodiments shown and described in FIG. 5, a display module DM-a according to one or more embodiments shown in FIG. 11 is different in the configuration of the light emitting elements ED-ft ED-G, ED-B and the light receiving element OPD.

Referring to FIG. 11, compared to embodiments shown in FIG. 5, the hole transport region HTR is different in that a common layer is disposed on throughout the light emitting elements ED-ft ED-G, and ED-B and the light receiving element OPD. The hole transport region HTR may be provided as a common layer that is not patterned to correspond to the light emitting regions PXA-R, PXA-G, and PXA-G and the light reception region IPA, and overlaps all of the pixel defining film PDL, the emission layer EML-R, EML-G, and EML-B, and the light receiving layer OPL.

In some embodiments, as shown in FIG. 11, the display device layer EDL may further include a capping layer CPL. The capping layer CPL may be disposed on the second electrode CE of the light emitting elements ED-ft ED-G, and ED-B and the light receiving element OPD. The capping layer CPL may be disposed between the second electrode CE and the encapsulation layer TFL. The capping layer CPL may be provided as a common layer overlapping all of the pixel defining film PDL, the emission layers EML-R, EML-G, and EML-B, and the light receiving layer OPL.

The capping layer CPL may include a multilayer or a single layer. In one or more embodiments, the capping layer CPL may be an organic layer or an inorganic layer. For example, in some embodiments, when the capping layer CPL includes an inorganic material, the inorganic material may include an alkali metal compound such as LiF, an alkaline earth metal compound such as $MgF_2$, SiON, $SiN_X$, SiOy, and/or the like.

For example, in some embodiments, when the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl)triphenylamine (TCTA), etc., or may include epoxy resins or acrylates such as methacrylates. However, embodiments of the present disclosure are not limited thereto.

In one or more embodiments shown in FIGS. 8 to 11, the light receiving element may include an electron extraction layer disposed between the light receiving layer and the electron blocking layer and including an n-dopant material to exhibit excellent or suitable efficiency.

Hereinafter, with reference to Examples and Comparative Examples, a light receiving element according to one or more embodiments of the present disclosure will be specifically described. In addition, Examples shown below are shown only for the understanding of the present disclosure, and the scope of the present disclosure is not limited thereto.

EXAMPLES

Production of Light Receiving Element 1—Examples 1 to 7, Comparative Examples 1 and 2

An ITO-patterned glass substrate was cleaned, and $WO_3$ (tungsten oxide) was deposited to have a thickness of 50 Å, thereby forming a hole injection layer. Thereafter, NPB was deposited to have a thickness of 300 Å to form a hole transport layer.

A light receiving layer including a donor compound and an acceptor compound was formed on the hole transport layer. In Example 1 to 7, an electron extraction layer including an n-dopant (i.e., an n-dopant material) was formed on the light receiving layer.

In Examples 1 to 7, a hole blocking layer and an electron transport layer were sequentially formed on the electron extraction layer, and in Comparative Examples 1 and 2, a hole blocking layer and an electron transport layer were sequentially formed on the light receiving layer. ET31, a triazine-based compound, was deposited to have a thickness of 50 Å to form the hole blocking layer, and ET34, a triazine-based compound, was doped with 10% of $Rb_2CO_3$ to form an electron transport layer having a thickness of 300 Å on the hole blocking layer. Thereafter, LiF was deposited to have a thickness of 10 Å to form an electron injection layer. Then, Al was provided at a thickness of 1000 Å to form a second electrode. The donor compounds, the acceptor compounds, and the n-dopant materials utilized in Examples and Comparative Examples are shown in Table 1. The triazine-based compounds utilized in the hole blocking layer and the electron transporting layer are shown in Table 1.

Production of Light Receiving Element 2—Example 8, Comparative Examples 3 to 5

Light receiving element 2 was produced in substantially the same manner as in the light receiving element 1, except that a first sub light receiving layer including a donor compound and a second sub light receiving layer including an acceptor compound were sequentially formed on a hole transport layer.

Production of Light Receiving Element 3 Examples 9 to 11

Light receiving element 3 was produced in substantially the same manner as in the light receiving element 1, except that a light receiving layer including a donor compound and not including an acceptor compound was formed on the hole transport layer and an electron extraction layer including an acceptor compound and an n-dopant was formed on the light receiving layer.

Production of Light Receiving Element 4 Examples 12 to 16

Light receiving element 4 was produced in substantially the same manner as in the light receiving element 2, except that an electron extraction layer including an acceptor compound and an n-dopant was formed on the second sub light receiving layer.

Production of Light Receiving Element 5 Examples 17 to 19, Comparative Example 6

Light receiving element 5 was produced in substantially the same manner as in the light receiving element 1, except that a light receiving layer including a first sub light receiving layer including a donor compound, a second sub light receiving layer including a donor compound and an acceptor compound, and a third sub light receiving layer including an acceptor compound was formed on the hole transport layer.

Production of Light Receiving Element 6 Example 20

Light receiving element 6 was produced in substantially the same manner as in the light receiving element 1, except that a light receiving layer including a first sub light receiving layer including a donor compound, and a second sub light receiving layer including a donor compound and an acceptor compound was formed on the hole transport layer, and a hole blocking layer including an acceptor compound and an n-dopant was formed.

Production of Light Receiving Element 7 Examples 21 to 23

Light receiving element 7 was produced in substantially the same manner as in the light receiving element 6, except that a hole blocking layer including a first sub hole blocking layer including an acceptor compound and an n-dopant, and a second sub hole blocking layer including an n-dopant was formed on the light receiving layer.

TABLE 1

| Item | Name | Compound name |
|---|---|---|
| Donor compound | D-1 | 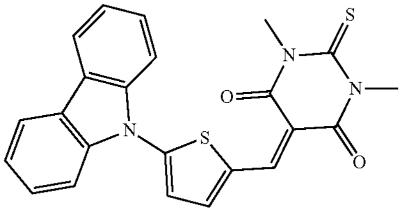 1 |
| Donor compound | D-2 | 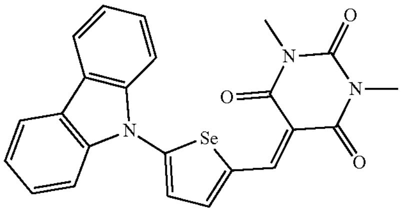 13 |
| Acceptor compound | A-1 | NTCDI (Naphthalenetetracarboxylic diimide) |
| Acceptor compound | A-2 | PTCDI (perylene tetracarboxylic diimide) |
| N-dopant | n-1 | Yb |
| N-dopant | n-2 | O-1:Yb |
| N-dopant | n-3 | O-2:Yb |
| N-dopant | n-4 | O-3:Yb |
| N-dopant | n-5 | O-4:Yb |
| N-dopant | n-6 | O-5:Yb |

n-dopant

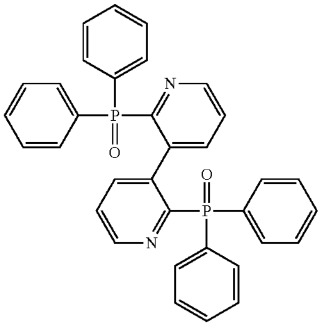

O-1

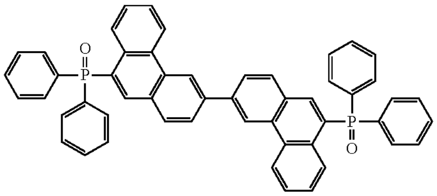

O-2

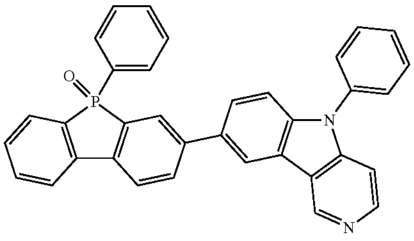

O-3

TABLE 1-continued

| Item | Name | Compound name |
|---|---|---|
| | | 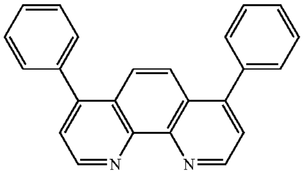 O-4 |
| | | 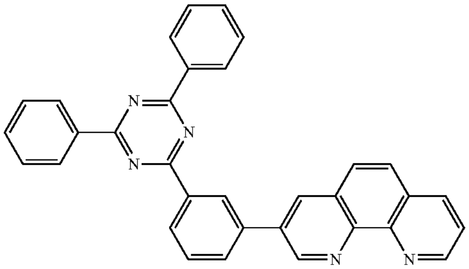 O-5 |

Material of Hole Blocking Layer and Electron Transport Layer

ET31

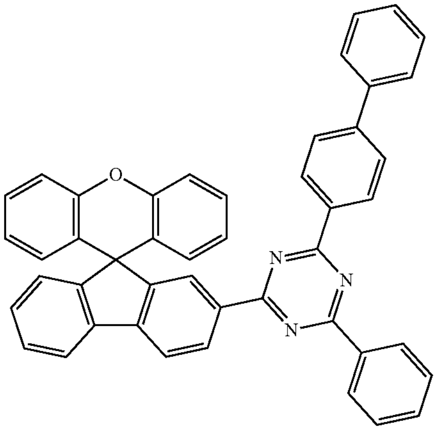

ET34

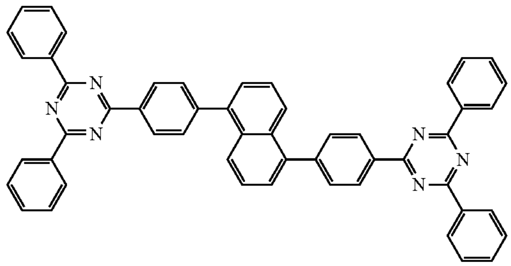

Evaluation of Characteristics of Light Receiving Element

Table 2 shows results of evaluation on light emitting elements for Examples 1 to 23, and Comparative Examples 1 to 6. Table 2 shows combinations of a donor compound, an acceptor compound, and an n-dopant material utilized in the produced light receiving elements.

Table 2 shows work function values of n-dopant materials and results of evaluation on efficiency of the light receiving elements produced through the combinations of the suggested materials. The work function was measured through Ultraviolet photoelectron spectroscopy (UPS). The conversion efficiency of a light receiving element at a voltage of −3 V is shown. In Table 2, efficiency ($EQE_{max}$) of light receiving elements shows a relative efficiency with respect to 100% when the whole is converted to photoelectric conversion efficiency.

TABLE 2

| Item | Donor compound | Acceptor compound | N-dopant | Work function (eV) | $EQE_{max}$ (%) |
|---|---|---|---|---|---|
| Example 1 | D-1 | A-1 | Yb | 2.6 | 58 |
| Example 2 | D-1 | A-2 | Yb | 2.6 | 38 |
| Example 3 | D-1 | A-2 | O-2:Yb | — | 41 |
| Example 4 | D-2 | A-1 | Yb | 2.6 | 25 |
| Example 5 | D-2 | A-1 | O-3:Yb | — | 26 |
| Example 6 | D-1 | A-1 | O-4:Yb | — | 58 |
| Example 7 | D-1 | A-1 | O-5:Yb | — | 60 |
| Example 8 | D-1 | A-1 | O-1:Yb | — | 15 |
| Example 9 | D-1 | A-1 | Yb | 2.6 | 35 |
| Example 10 | D-1 | A-1 | O-4:Yb | — | 45 |
| Example 11 | D-2 | A-2 | O-5:Yb | — | 41 |
| Example 12 | D-1 | A-1 | O-1:Yb | — | 42 |
| Example 13 | D-1 | A-2 | Yb | 2.6 | 33 |
| Example 14 | D-1 | A-2 | O-2:Yb | — | 32 |
| Example 15 | D-2 | A-2 | Yb | 2.6 | 22 |
| Example 16 | D-2 | A-2 | O-1:Yb | — | 21 |
| Example 17 | D-1 | A-1 | Yb | 2.6 | 30 |
| Example 18 | D-1 | A-2 | Yb | 2.6 | 28 |
| Example 19 | D-1 | A-2 | O-2:Yb | — | 30 |
| Example 20 | D-1 | A-1 | O-1:Yb | — | 28 |
| Example 21 | D-1 | A-1 | Yb | 2.6 | 25 |
| Example 22 | D-1 | A-1 | O-4:Yb | — | 42 |
| Example 23 | D-2 | A-2 | O-5:Yb | — | 37 |
| Comparative Example 1 | D-1 | A-1 | — | — | 5 |
| Comparative Example 2 | D-2 | A-2 | — | — | 10 |
| Comparative Example 3 | D-1 | A-1 | — | — | 33 |
| Comparative Example 4 | D-2 | A-2 | — | — | 28 |
| Comparative Example 5 | D-1 | A-1 | — | — | 15 |
| Comparative Example 6 | D-1 | A-1 | — | — | 15 |

Referring to the results of Table 2, it is seen that Examples including electron extraction layers including n-dopant materials on light receiving layers of light receiving elements exhibit greater light receiving element efficiency than Comparative Examples that do not include electron extraction layers.

An electronic device of one or more embodiments of the present disclosure includes both (e.g., simultaneously) a light emitting element and a light receiving element in a display element layer, and includes an electron extraction layer including an n-dopant material on a light receiving layer of the light receiving element to facilitate electron extraction from the light receiving element, and may thus exhibit excellent or suitable light receiving element characteristics. In addition, the electronic device of an embodiment includes an electron extraction layer that separates from an electron transport layer and includes an n-dopant material in the light receiving element, and may thus exhibit increased efficiency of light receiving element characteristics.

One or more embodiments of the present disclosure may provide an electronic device having increased photoelectric efficiency by including an electron extraction layer above a light receiving layer of a light receiving element to facilitate movement of electrons generated from the light receiving layer.

As utilized herein, the singular forms "a," "an," "one," and "the" are intended to include the plural forms as well, unless the context clearly indicates otherwise. Further, the use of "may" when describing embodiments of the present disclosure may refer to "one or more embodiments of the present disclosure".

As utilized herein, the terms "substantially," "about," or similar terms are used as terms of approximation and not as terms of degree, and are intended to account for the inherent deviations in measured or calculated values that would be recognized by those of ordinary skill in the art. "About" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The light-emitting element, the light-receiving element, the display module, the electronic device, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the present disclosure has been described with reference to exemplary embodiments of the present disclosure, it will be understood that the present disclosure should not be limited to these embodiments but one or more suitable changes and modifications can be made by those skilled in the art without departing from the spirit and scope of the present disclosure.

Hence, the technical scope of the present disclosure is not limited to the detailed descriptions in the present disclosure but should be determined only with reference to the claims and equivalents thereof.

What is claimed is:

1. An electronic device comprising:

a base layer; and a display element layer on the base layer and comprising a pixel defining film having an opening defined therein, and a light emitting element and a light receiving element which are divided by the pixel defining film, wherein the light emitting element and the light receiving element each comprise:

a first electrode;

a hole transport region on the first electrode;

an electron transport region on the hole transport region and comprising a hole blocking layer comprising a triazine-based compound, and a sub electron transport region on the hole blocking layer; and a second electrode on the electron transport region, wherein the light emitting element comprises an emission layer between the hole transport region and the electron transport region, and wherein the light receiving element comprises:

a light receiving layer between the hole transport region and the electron transport region, the light receiving layer being to convert incident light into electrical signals; and an electron extraction layer between the light receiving layer and the electron transport region and comprising an n-dopant material.

2. The electronic device of claim 1, wherein the n-dopant material comprises a metal having a work function of 3.0 eV or less.

3. The electronic device of claim 2, wherein the n-dopant material comprises lithium (Li), ytterbium (Yb), magnesium (Mg), silver (Ag), calcium (Ca), or sodium (Na).

4. The electronic device of claim 2, wherein the electron extraction layer further comprises an organic compound, and the organic compound is to form a chelate with the metal having a work function of 3.0 eV or less.

5. The electronic device of claim 4, wherein the organic compound is represented by any one selected from among compounds of Compound Group 2 and compounds of Compound Group 3:

Compound Group 2

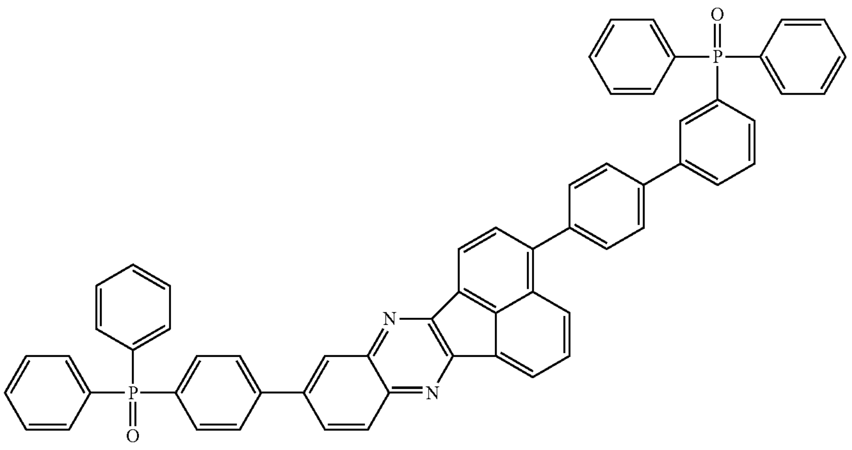

1

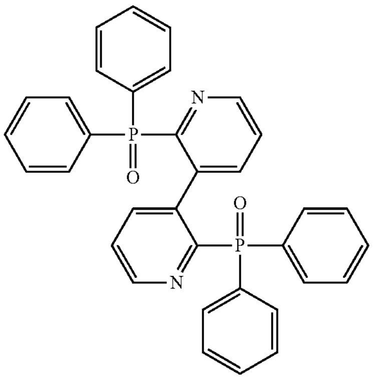

2

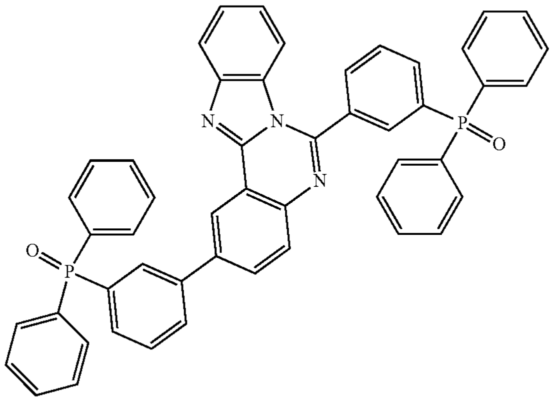

3

-continued
4
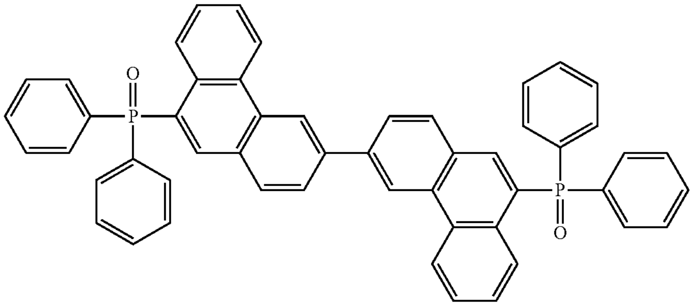
5
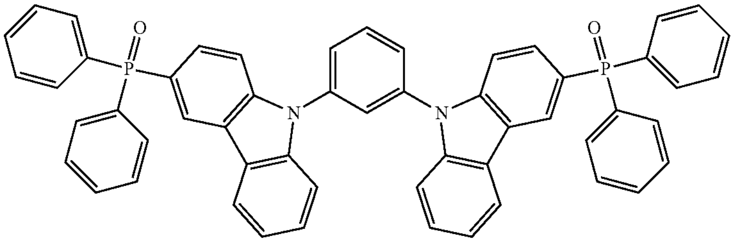
6
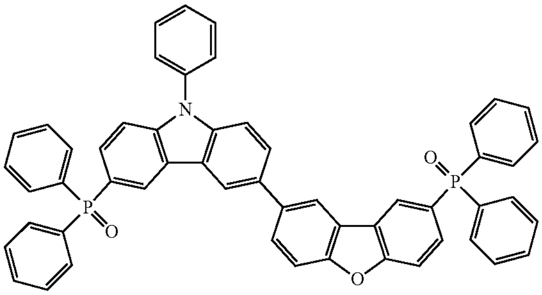
7
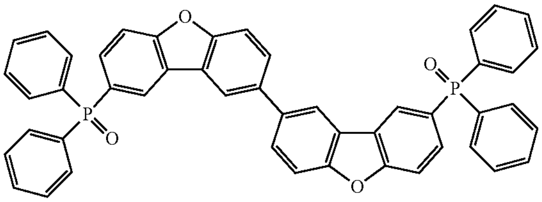
8
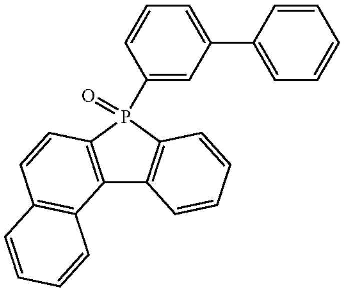
9
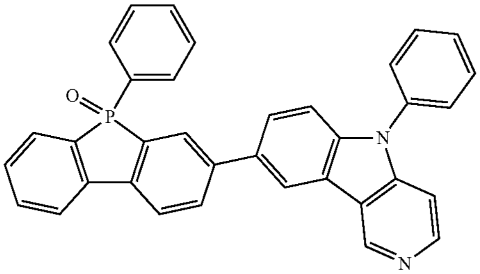
10
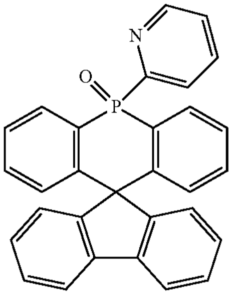
11
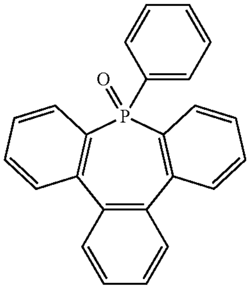

-continued
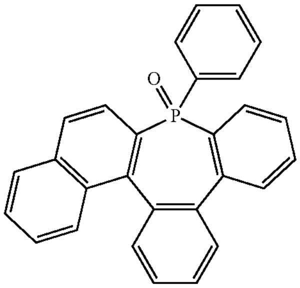
12
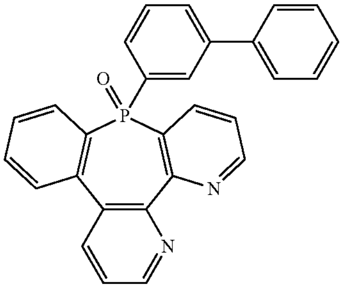
13
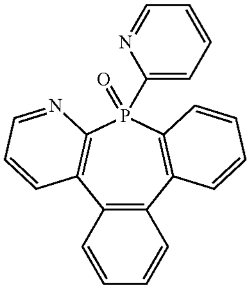
14
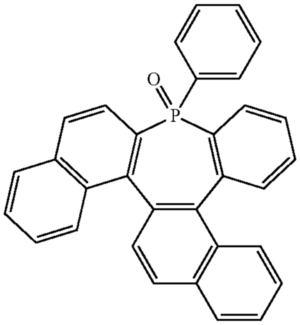
15
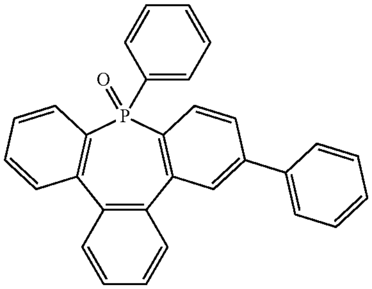
16
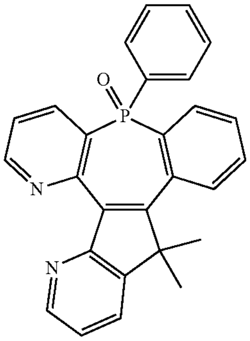
17
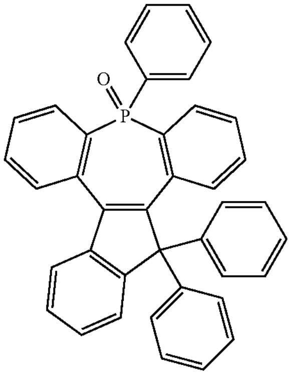
18
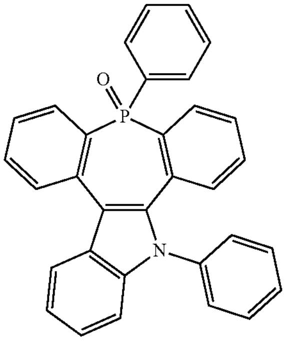
19
Compound Group 3
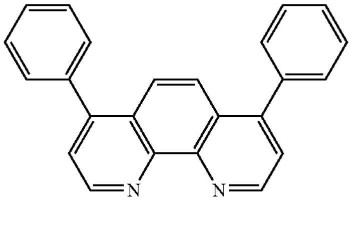
20
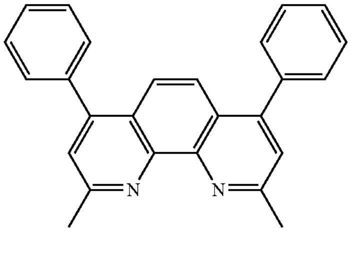
21

-continued

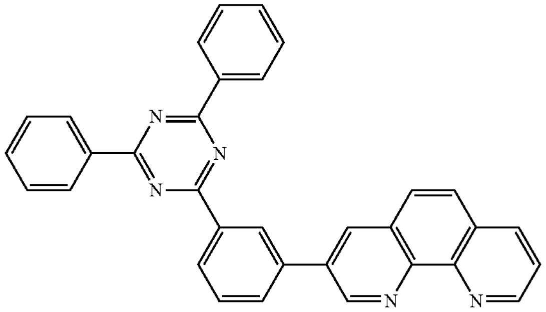

22

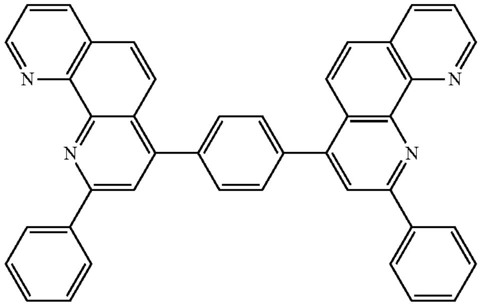

23

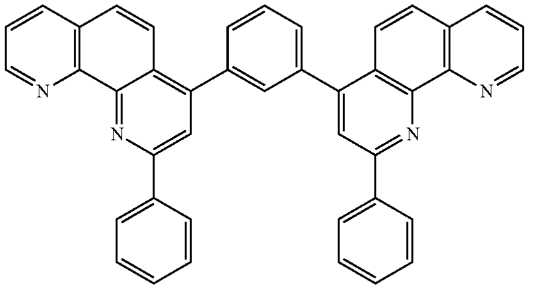

24

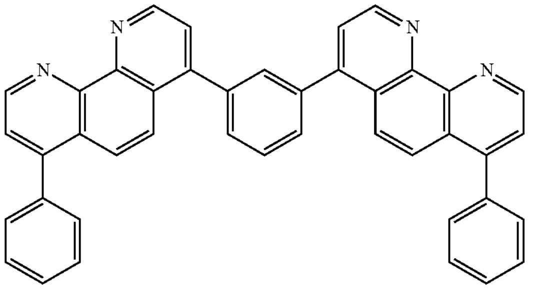

25

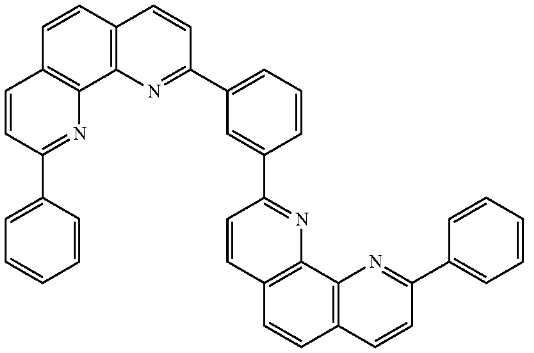

26

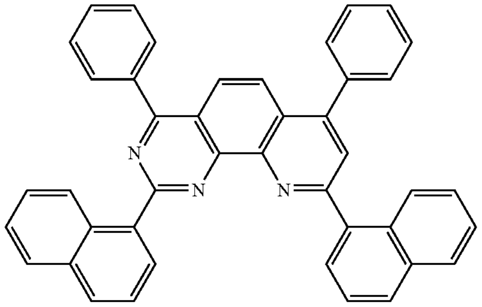

27

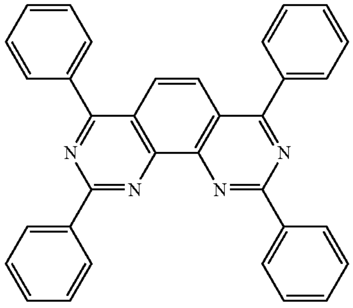

28

.

6. The electronic device of claim 4, wherein the n-dopant material has a doping concentration of about 0.5 vol % to about 10 vol % with respect to the organic compound.

7. The electronic device of claim 1, wherein the light receiving layer comprises a donor compound and an acceptor compound, and the acceptor compound comprises a fullerene derivative, a perylene tetracarboxylic diimide (PTCDI) derivative, a perylene tetracarboxylic dianhydride (PTCDA) derivative, a 1,4,5,8-naphthalenetetracarboxylic dianhydride (NTCDA) derivative, or a naphthalenetetracarboxylic diimide (NTCDI) derivative.

8. The electronic device of claim 7, wherein the electron extraction layer further comprises the acceptor compound.

9. The electronic device of claim 7, wherein the electron extraction layer comprises:

a first sub electron extraction layer comprising the acceptor compound; and a second sub electron extraction layer not comprising the acceptor compound.

10. The electronic device of claim 7, wherein the donor compound comprises a phthalocyanine-based compound, or a perylene-based compound.

11. The electronic device of claim 7, wherein the light receiving layer comprises:

a first sub light receiving layer comprising the donor compound and not comprising the acceptor compound; and a second sub light receiving layer on the first sub light receiving layer, not comprising the donor compound, and comprising the acceptor compound.

12. The electronic device of claim 7, wherein the light receiving layer comprises:

a first sub light receiving layer comprising the donor compound and not comprising the acceptor compound; and a second sub light receiving layer on the first sub light receiving layer and comprising the donor compound and the acceptor compound.

13. The electronic device of claim 1, wherein the electron extraction layer has a thickness of about 10 Å to about 100 Å.

14. The electronic device of claim 1, wherein the hole blocking layer is provided as a single layer in the light emitting element and the light receiving element.

15. The electronic device of claim 1, wherein the hole blocking layer does not comprise the n-dopant material.

16. The electronic device of claim 1, wherein the triazine-based compound is represented by any one selected from among ET-31 to ET-37:

ET31

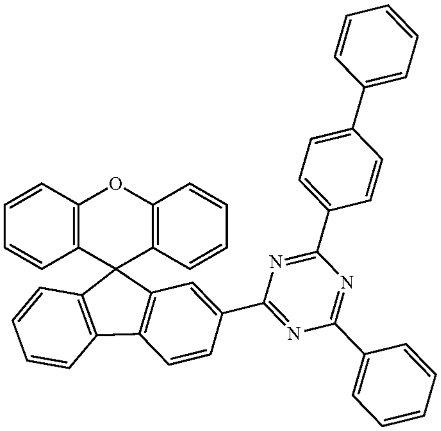

ET32

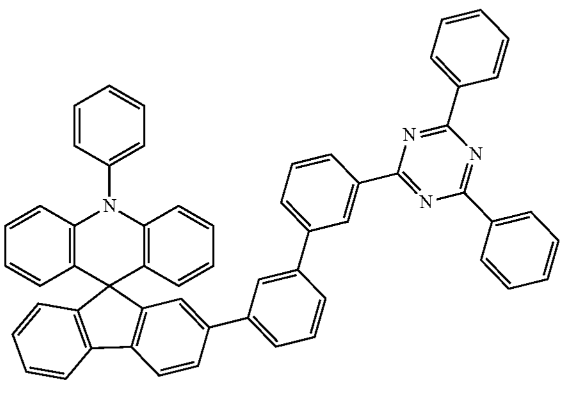

-continued

ET33

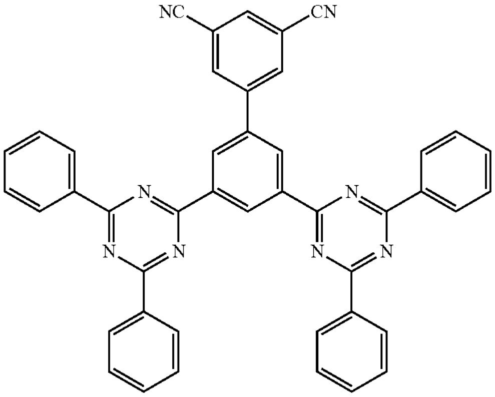

ET34

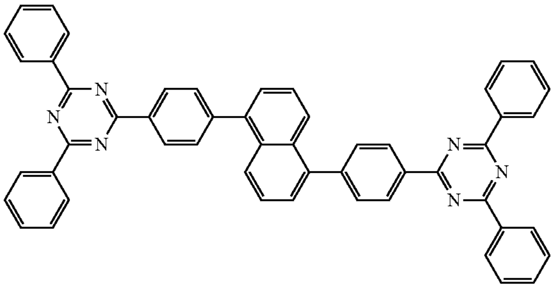

ET35

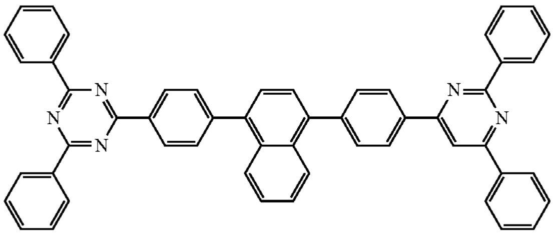

ET36

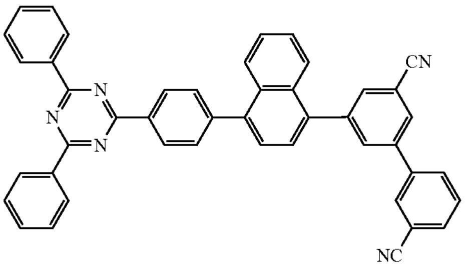

ET37

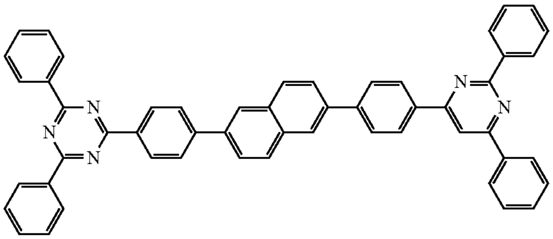

.

17. An electronic device comprising a display module divided into a red light emitting region, a green light emitting region, a blue light emitting region, and a light receiving region, which are apart in a plan view, wherein the display module comprises:

a base layer;

a display element layer on the base layer and comprising a light emitting element and a light receiving element; and an input sensing layer on the display element layer, the display element layer comprising:

a first electrode;

a hole transport region on the first electrode;

an electron transport region on the hole transport region and comprising a hole blocking layer comprising a triazine-based compound, and a sub electron transport region on the hole blocking layer; and a second electrode on the electron transport region, the light emitting element comprising an emission layer between the hole transport region and the electron transport region, and the light receiving element comprising a light receiving layer between the hole transport region and the electron transport region, and an electron extraction layer between the light receiving layer and the electron transport region and non-overlapping the emission layer.

18. The electronic device of claim 17, wherein the electron extraction layer comprises an n-dopant material, and the hole blocking layer does not comprise the n-dopant material.

19. The electronic device of claim 17, wherein the electron extraction layer comprises a metal having a work function of 3.0 eV or less, or a metal having a work function of 3.0 eV or less and an organic compound being to form a chelate with the metal.

20. The electronic device of claim 19, wherein the organic compound is represented by any one selected from among compounds of Compound Group 2 and compounds of Compound Group 3:

Compound Group 2

1

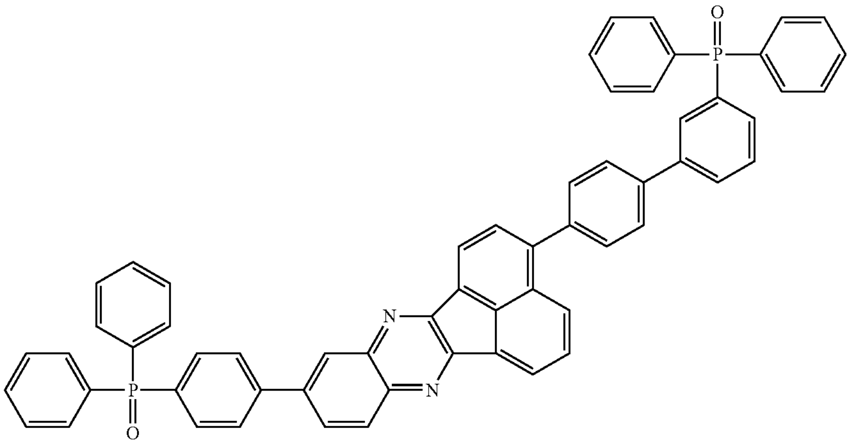

2

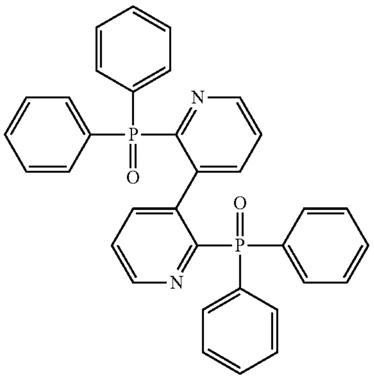

3

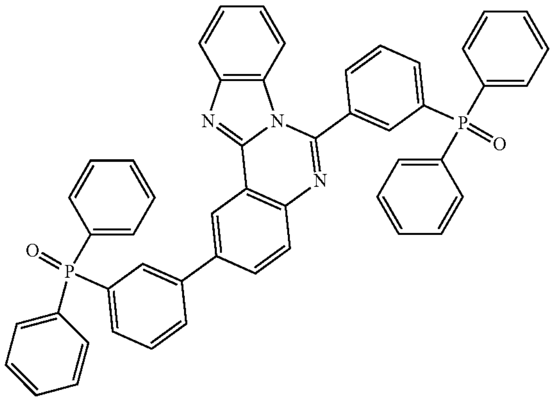

-continued
4
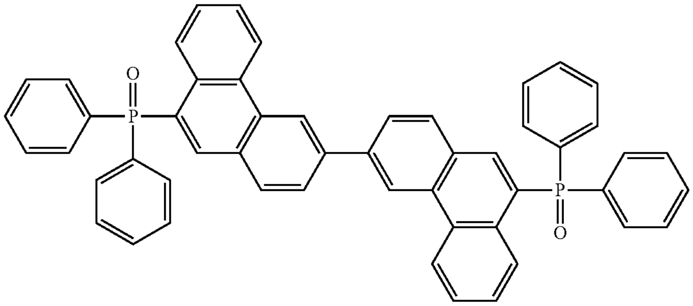
5
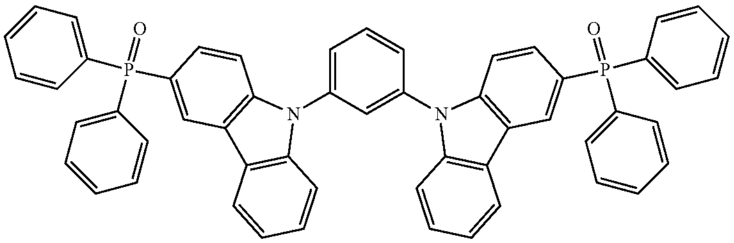
6
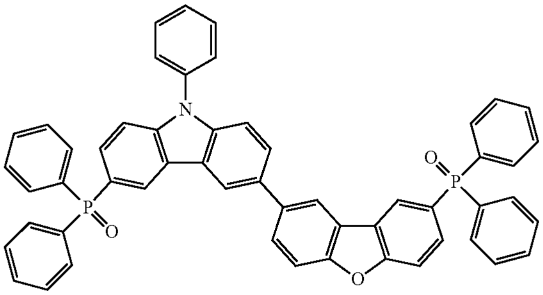
7
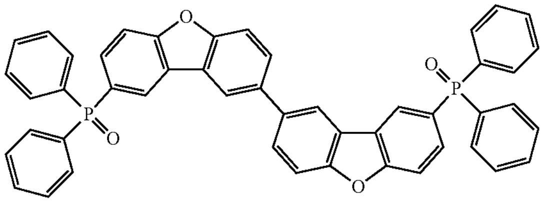
8
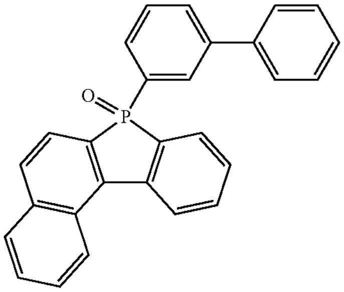
9
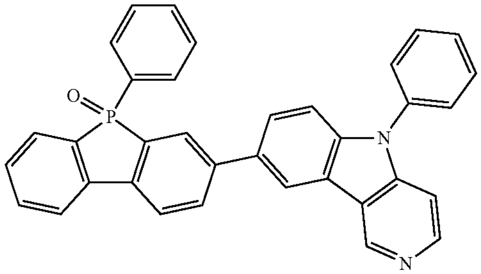
10
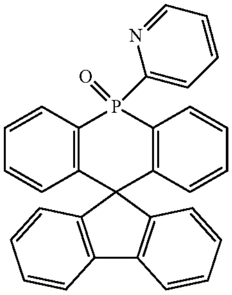
11
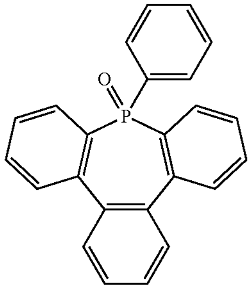

-continued
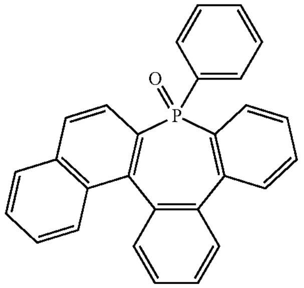
12
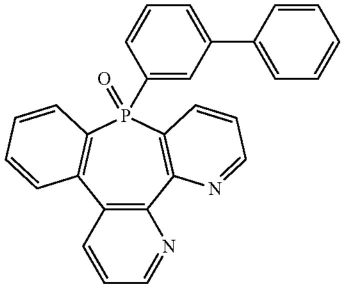
13
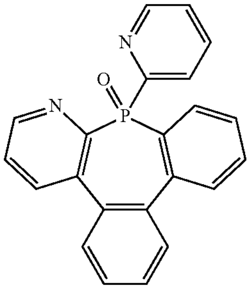
14
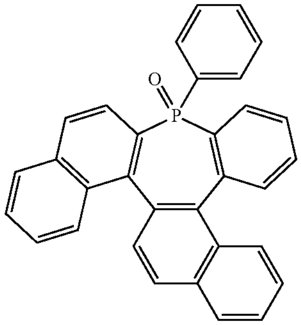
15
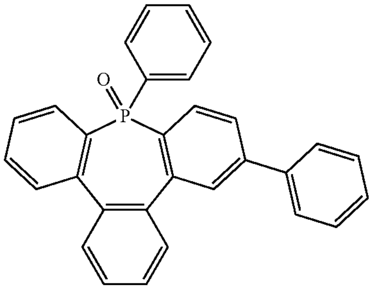
16
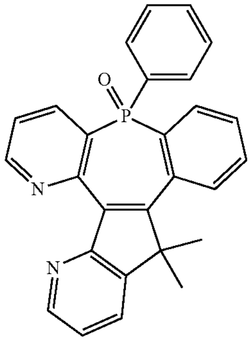
17
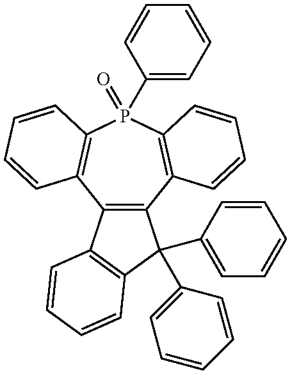
18
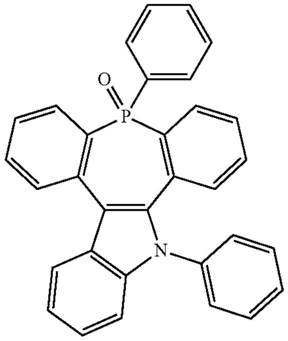
19
Compound Group 3
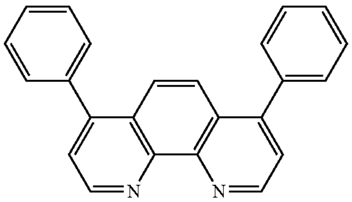
20
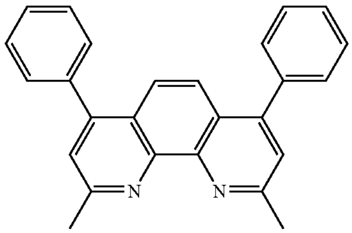
21

-continued

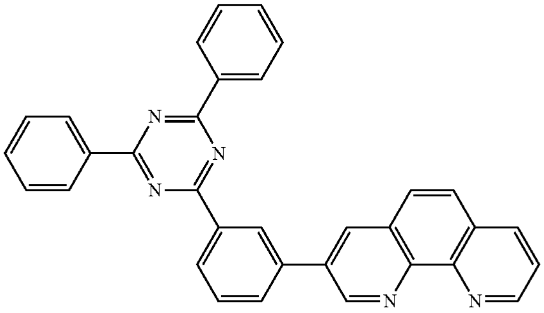
22

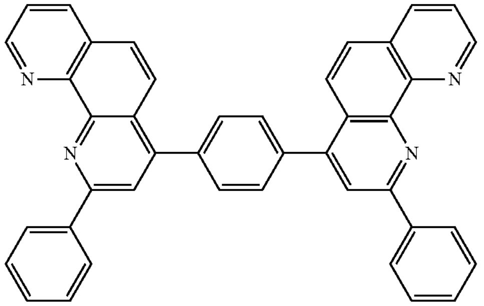
23

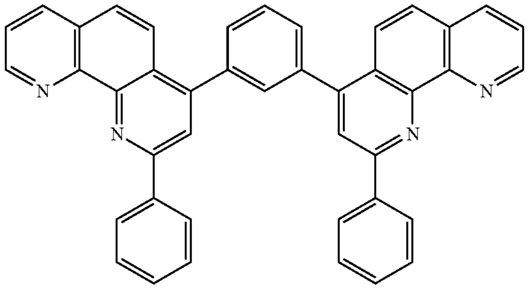
24

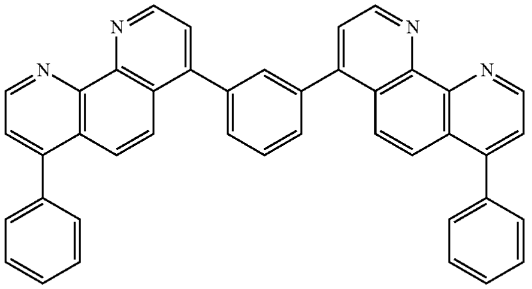
25

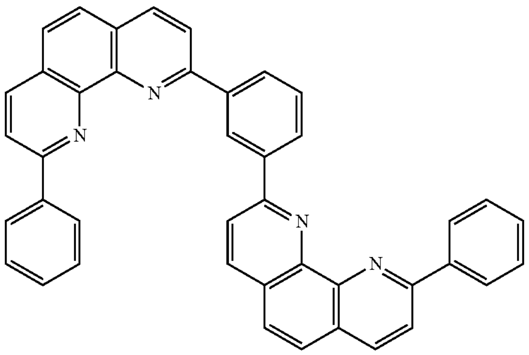
26

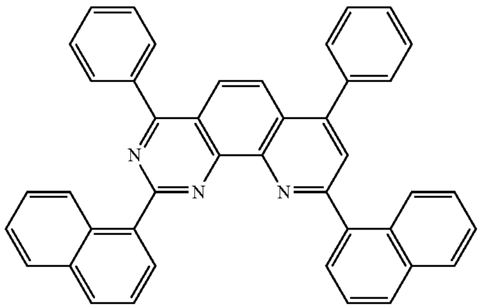
27

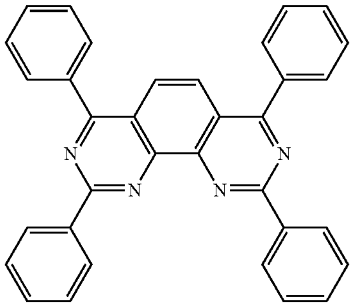
28

21. The electronic device of claim 20, wherein the light receiving layer comprises a donor compound and an acceptor compound, and the acceptor compound comprises a fullerene derivative, a perylene tetracarboxylic diimide (PTCDI) derivative, a perylene tetracarboxylic dianhydride (PTCDA) derivative, a 1,4,5,8-naphthalenetetracarboxylic dianhydride (NTCDA) derivative, or a naphthalenetetracarboxylic diimide (NTCDI) derivative.

22. The electronic device of claim 21, wherein the electron extraction layer further comprises the acceptor compound.

23. The electronic device of claim 17, wherein the light emitting element comprises a red light emitting element corresponding to the red light emitting region, a blue light emitting element corresponding to the blue light emitting region, and a green light emitting element corresponding to the green light emitting region.

24. The electronic device of claim 17, wherein the hole transport region of the light receiving element comprises the same material as the hole transport region of the light emitting element.

25. The electronic device of claim 17, wherein the electron transport region of the light receiving element comprises the same material as the electron transport region of the light emitting element.

26. The electronic device of claim 17, wherein the triazine-based compound is represented by any one selected from among ET-31 to ET-37:

ET31

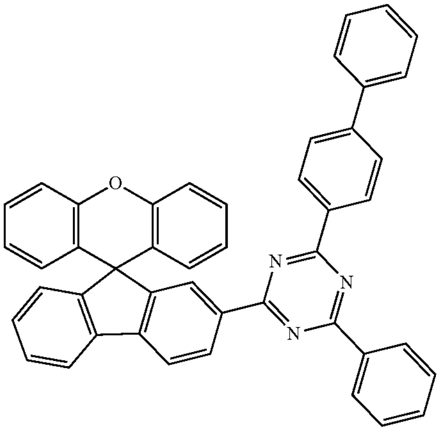

ET32

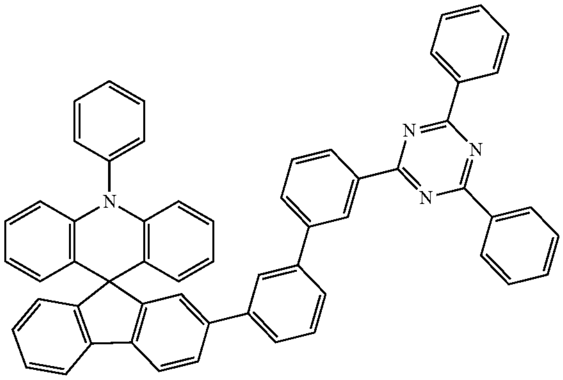

ET33

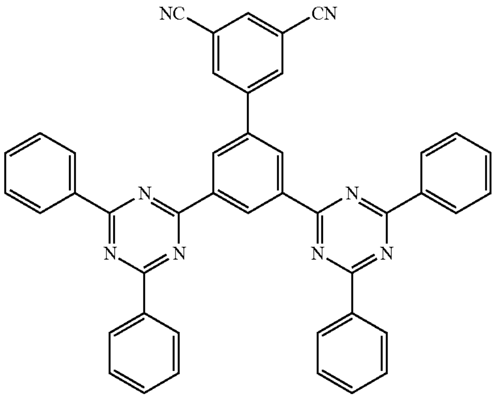

-continued

ET34

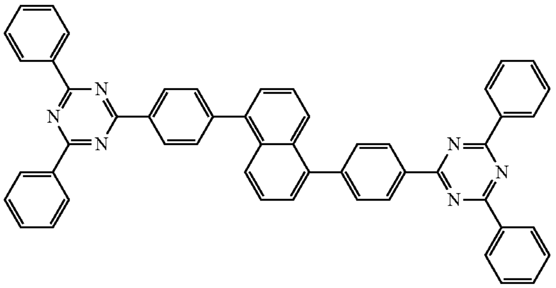

ET35

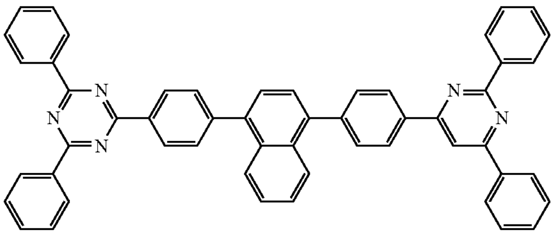

ET36

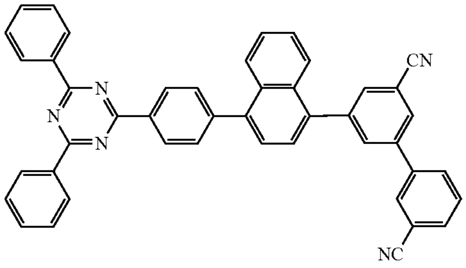

ET37

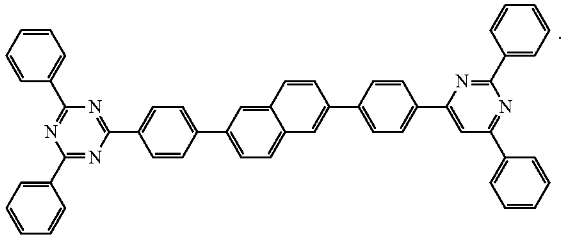

* * * * *